US011927890B1

(12) United States Patent
Heo et al.

(10) Patent No.: US 11,927,890 B1
(45) Date of Patent: Mar. 12, 2024

(54) SUBSTRATE PROCESSING APPARATUS AND METHOD OF FABRICATING SEMICONDUCTOR DEVICE USING THE SAME

(71) Applicant: Samsung Electronics Co., Ltd., Suwon-si (KR)

(72) Inventors: Seok Heo, Suwon-si (KR); Cha Won Koh, Suwon-si (KR); Sang Joon Hong, Suwon-si (KR); Hyun Woo Kim, Suwon-si (KR); Kyung-Won Kang, Suwon-si (KR); Dong-Wook Kim, Suwon-si (KR); Kyung Won Seo, Suwon-si (KR); Young Il Jang, Suwon-si (KR); Yong Suk Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/892,379

(22) Filed: Aug. 22, 2022

(30) Foreign Application Priority Data

Aug. 24, 2021 (KR) .......................... 10-2021-0111663
Jul. 12, 2022 (KR) .......................... 10-2022-0085634

(51) Int. Cl.
*G03F 7/00* (2006.01)
*G03F 7/16* (2006.01)
*H01L 21/677* (2006.01)
*H01L 21/687* (2006.01)

(52) U.S. Cl.
CPC .......... *G03F 7/70875* (2013.01); *G03F 7/168* (2013.01); *G03F 7/70033* (2013.01); *H01L 21/67703* (2013.01); *H01L 21/68707* (2013.01)

(58) Field of Classification Search
CPC ........................... G03F 7/70033; G03F 7/168
See application file for complete search history.

(56) References Cited

U.S. PATENT DOCUMENTS

| 6,503,003 | B2 * | 1/2003 | Hasebe | G03F 7/162 |
| | | | | 430/311 |
| 6,551,400 | B2 * | 4/2003 | Hasbe | G03F 7/162 |
| | | | | 118/52 |
| 7,802,536 | B2 * | 9/2010 | Yoshihara | G03F 7/162 |
| | | | | 118/612 |
| 7,924,396 | B2 * | 4/2011 | Kawano | G03F 7/168 |
| | | | | 396/611 |

FOREIGN PATENT DOCUMENTS

| KR | 19980019185 A | 6/1998 |
| KR | 20010104650 A | 11/2001 |
| KR | 20020010442 A | 2/2002 |
| KR | 20060090589 A | 8/2006 |
| KR | 20180033848 A | 4/2018 |
| KR | 20220047059 A | 4/2022 |

* cited by examiner

*Primary Examiner* — Hung V Nguyen
(74) *Attorney, Agent, or Firm* — Muir Patent Law, PLLC

(57) ABSTRACT

A substrate processing apparatus includes a photoresist coater applying a photoresist film on a substrate, a humidifier increasing an amount of moisture in an ambient to which the photoresist film on the substrate is exposed, and an exposer irradiating the photoresist film exposed to the ambient having the increased amount of moisture with light. The humidifier is disposed between the photoresist coater and the exposer.

16 Claims, 23 Drawing Sheets

SUBSTRATE PROCESSING APPARATUS AND METHOD OF FABRICATING SEMICONDUCTOR DEVICE USING THE SAME

This application claims priority from Korean Patent Applications 10-2022-0085634 filed on Jul. 12, 2022, and 10-2021-0111663 filed on Aug. 24, 2021, in the Korean Intellectual Property Office, the disclosure of which is incorporated herein by reference in its entirety.

BACKGROUND

1. Field of the Disclosure

The present disclosure relates to a to a substrate processing apparatus and a method of fabricating a semiconductor device using the same.

2. Description of the Related Art

As semiconductor memory devices, semiconductor logic devices, and the like are increasingly highly integrated, the sizes of various patterns constituting each device are further miniaturized. Contrary to such trend of miniaturization of semiconductor device patterns, the size of a semiconductor wafer is gradually increasing in terms of productivity improvement. Since the size of a substrate such as a semiconductor wafer and a photomask is becoming larger despite the miniaturization of the patterns, the importance of uniformly forming and managing the critical dimension (CD) of device patterns repeatedly formed inside an enlarged semiconductor wafer or photomask over the entire position of the substrate is gradually increasing.

In order to form a uniform and fine pattern, strict management of the humidity of the substrate is required. For example, since a metal photoresist binds with moisture to easily denaturalize the photoresist, strict management of humidity is required.

SUMMARY

Aspects of the present disclosure provide a substrate processing apparatus having improved substrate management performance.

Aspects of the present disclosure also provide a method of fabricating a semiconductor device using a substrate processing apparatus having improved substrate management performance.

According to some aspects of the present inventive concept, a substrate processing apparatus includes a photoresist coater applying a photoresist film on a substrate, a humidifier increasing an amount of moisture in an ambient to which the photoresist film on the substrate is exposed, and an exposer irradiating the photoresist film exposed to the ambient having the increased amount of moisture with light. The humidifier is disposed between the photoresist coater and the exposer.

According to some aspects of the present inventive concept, a substrate processing apparatus includes a photoresist coater applying a metal photoresist film on a substrate, an exposer irradiating the metal photoresist film with light, a photoresist develop unit developing the irradiated metal photoresist film on the substrate, a baking unit baking the substrate with the developed photoresist film, and a dehumidifier reducing an amount of moisture in an ambient to which the baked substrate is exposed. The dehumidifier is spatially separated from the photoresist coater, the exposer, the photoresist develop unit, and the baking unit.

According to some aspects of the present inventive concept, a substrate processing apparatus includes a photoresist coater applying a photoresist film on a substrate, an exposer irradiating the photoresist film with extreme ultraviolet (EUV) light, a photoresist develop unit developing the photoresist film on the substrate exposed by the exposer, a baking unit baking the substrate with developed photoresist, a humidifier increasing an amount of moisture in an ambient to which the substrate is exposed, and a dehumidifier reducing an amount of moisture in an ambient to which the substrate is exposed. The baking unit includes a plurality of baking chambers facing the photoresist coater and baking the substrate. The humidifier is stacked with the plurality of baking chambers. The dehumidifier is disposed between the photoresist coater and the exposer.

According to some aspects of the present inventive concept, a method of fabricating a semiconductor device includes loading a substrate into a substrate processing apparatus, applying a metal photoresist film on the substrate, irradiating light to the metal photoresist film on the substrate, increasing an amount of moisture in an ambient to which the substrate with the metal photoresist film is exposed in a humidifier before the irradiating of the light to the substrate with the metal photoresist film, and reducing an amount of moisture in an ambient to which the substrate with the irradiated photoresist film is exposed in a dehumidifier after the irradiating of the light to the substrate with the photoresist film.

It should be noted that objects of the present disclosure are not limited to the above-described objects, and other objects of the present disclosure will be apparent to those skilled in the art from the following descriptions.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, embodiments of the present disclosure will be described with reference to the accompanying drawings.

Figure 1:
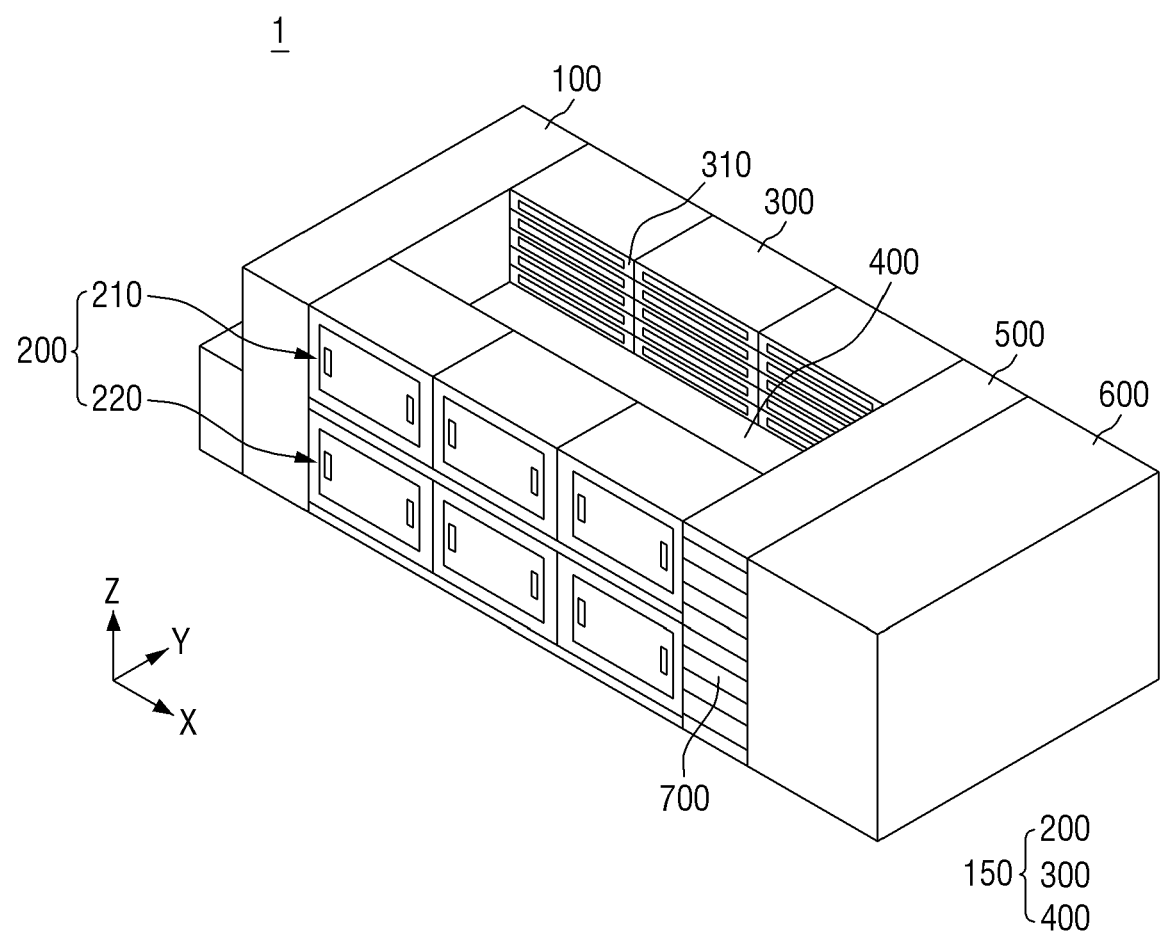
FIG. 1 is a view illustrating a substrate processing apparatus according to some embodiments of the present disclosure.
Figure 2:
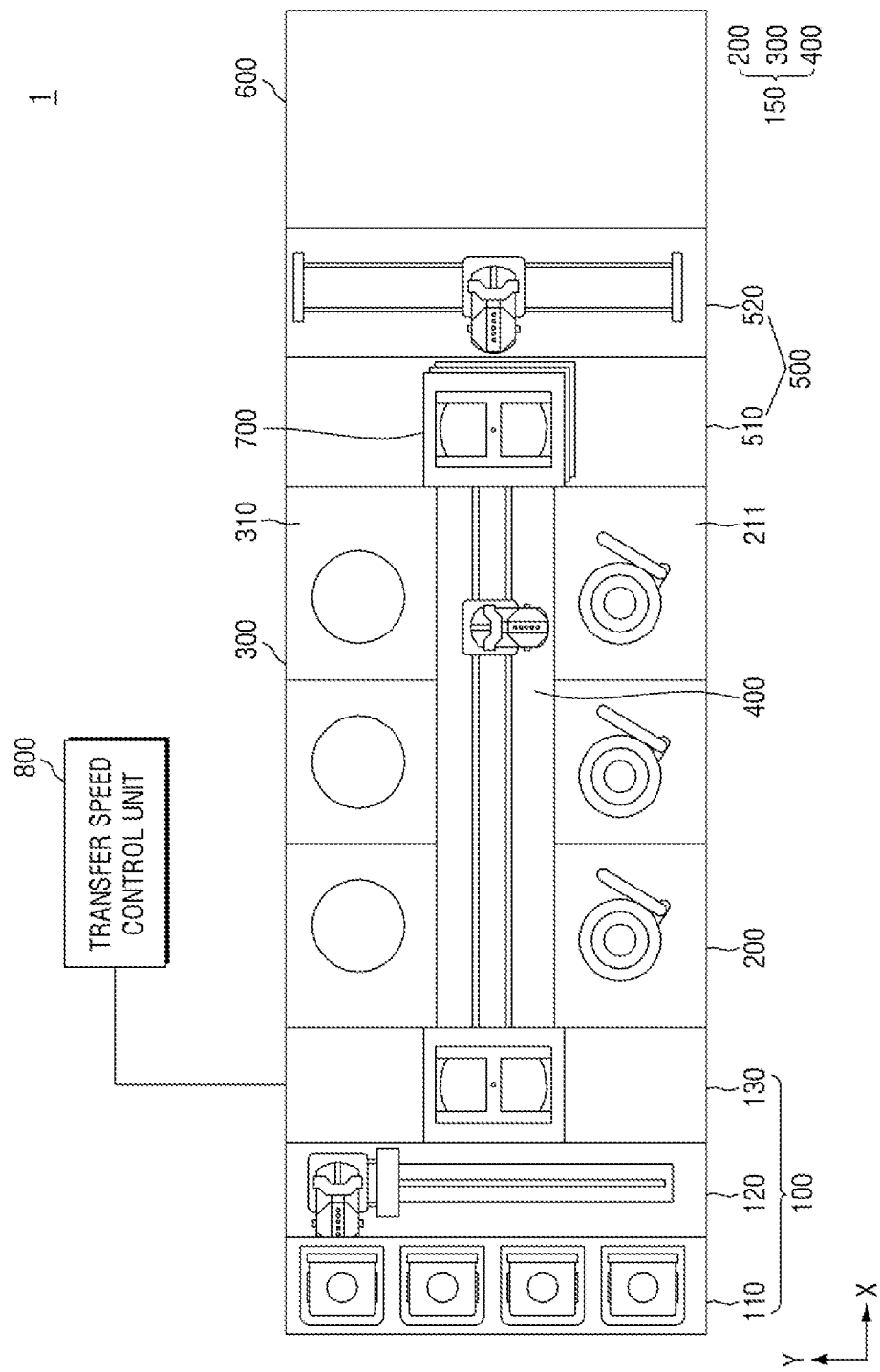
FIG. 2 is a plan view illustrating the substrate processing apparatus of FIG. 1.
Figure 3:
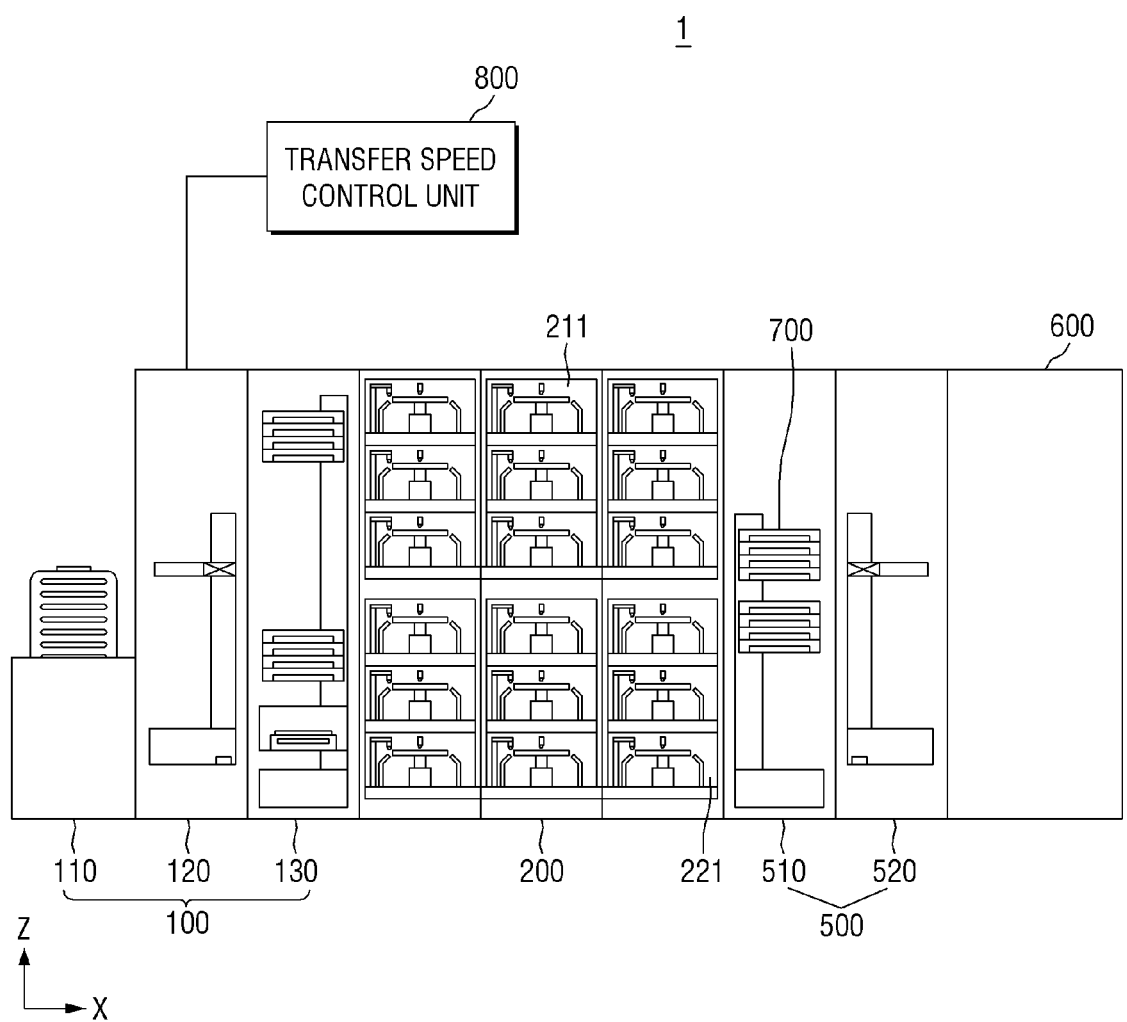
FIG. 3 is a side view illustrating the substrate processing apparatus of FIG. 1.

FIG. 1 is a view illustrating a substrate processing apparatus according to some embodiments of the present disclosure. FIG. 2 is a plan view illustrating the substrate processing apparatus of FIG. 1. FIG. 3 is a side view illustrating the substrate processing apparatus of FIG. 1.

Referring to FIGS. 1 to 3, a substrate processing apparatus 1 includes an index unit 100, a processing unit 150, an interface unit 500 (i.e., a substrate stocker), an exposure unit 600 (i.e., an exposer), a humidity control unit 700 (i.e., a humidifier), and a transfer speed control unit 800. The processing unit 150 includes a spin unit 200, a baking unit 300, and a transfer unit 400.

The index unit 100 may include a load port 110, an index robot 120, and a first buffer module 130. In an embodiment, the load port 110 may be provided in plural.

The load port 110 may have a mounting table on which a cassette with a substrate accommodated therein is placed. The load port 110 may include a plurality of mounting tables. The plurality of mounting tables may be arranged in a line along a second direction Y. In FIG. 2, the load port 110 is illustrated as including four mounting tables, but the embodiment is not limited thereto. The number of mounting tables included in the load port 110 may be changed according to embodiments.

The index robot 120 may transfer a substrate W between the load port 110 and the first buffer module 130. The index robot 120 may include a frame, a transfer robot, and a guide rail. The frame may be provided in the shape of a rectangular parallelepiped with an empty interior, and may be arranged between the load port 110 and the first buffer module 130. The transfer robot and the guide rail may be arranged within the frame. The transfer robot may include a structure capable of four-axis driving so that the transfer robot is movable and rotated in a first direction X, the second direction Y, and a third direction Z.

The first buffer module 130 may have a shape of a rectangular parallelepiped with an empty interior for temporarily storing a plurality of substrates W. The first buffer module 130 may be arranged between the index robot 120 and the processing unit including the spin unit 200, the baking unit 300, and the transfer unit 400.

The spin unit 200 may include a coating unit 210 (i.e., a photoresist coater) that performs a process of coating a photoresist on the substrate W before an exposure process, and a develop unit 220 that performs a process of developing the substrate W after the exposure process. The coating unit 210 and the develop unit 220 may be arranged to be distinguished from each other in layers (i.e., may be arranged in vertical levels). For example, the coating unit 210 may be disposed on the develop unit 220. In an embodiment, the coating unit 210 may be disposed under the develop unit 220.

The coating unit 210 performs a process of applying a photosensitive solution such as a photoresist on the substrate W. For example, the coating unit 210 may apply a metal photoresist on the substrate W.

The coating unit 210 may include a plurality of coating chambers 211. The coating chambers 211 of the coating unit 210 may be continuously arranged along the first direction X, and may be stacked and arranged along the third direction Z. The plurality of coating chambers 211 may all have the same structure. The types of photoresist used in the respective coating chambers 211 may be different from each other.

Although it is illustrated in FIGS. 2 and 3 that three coating chambers 211 are arranged in each of the first direction X and the third direction Z, the embodiment is not limited thereto. The number of coating chambers 211 arranged along the first direction X and the third direction Z may be variously changed according to embodiments.

The develop unit 220 may perform a developing process of removing a portion of the photoresist by supplying a developer to obtain a pattern on the substrate W. The develop unit 220 may remove an area irradiated with light from the photoresist on the substrate W. Depending on the type of the selectively used photoresist, only an area of the photoresist to which no light is irradiated may be removed.

The develop unit 220 may include a plurality of developing chambers 221. The developing chambers 221 of the develop unit 220 may be continuously arranged along the first direction X. The developing chambers 221 of the develop unit 220 may be stacked and arranged in the third direction Z. The plurality of developing chambers 221 may all have the same structure. The types of developer used in the respective develop units 220 may be different from each other.

Although it is illustrated in FIGS. 2 and 3 that three development chambers 221 are arranged in the first direction X and the third direction Z, the embodiment is not limited thereto. The number of developing chambers 221 arranged in the first direction X and the third direction Z may be variously changed according to embodiments.

The baking unit 300 performs a heat treatment process for heating or cooling the substrate W. The baking unit 300 may perform a pre-bake process of heating the substrate W to a predetermined temperature before coating the photoresist to remove organic matter or moisture from the surface of the substrate W, a soft-bake process performed after applying the photoresist on the substrate W, a post-bake process of heating the substrate W before a development process is performed, a hard bake process of heating the substrate W after the development process is performed, and a cooling process of cooling the heated wafer after each bake process is performed.

Figure 12:
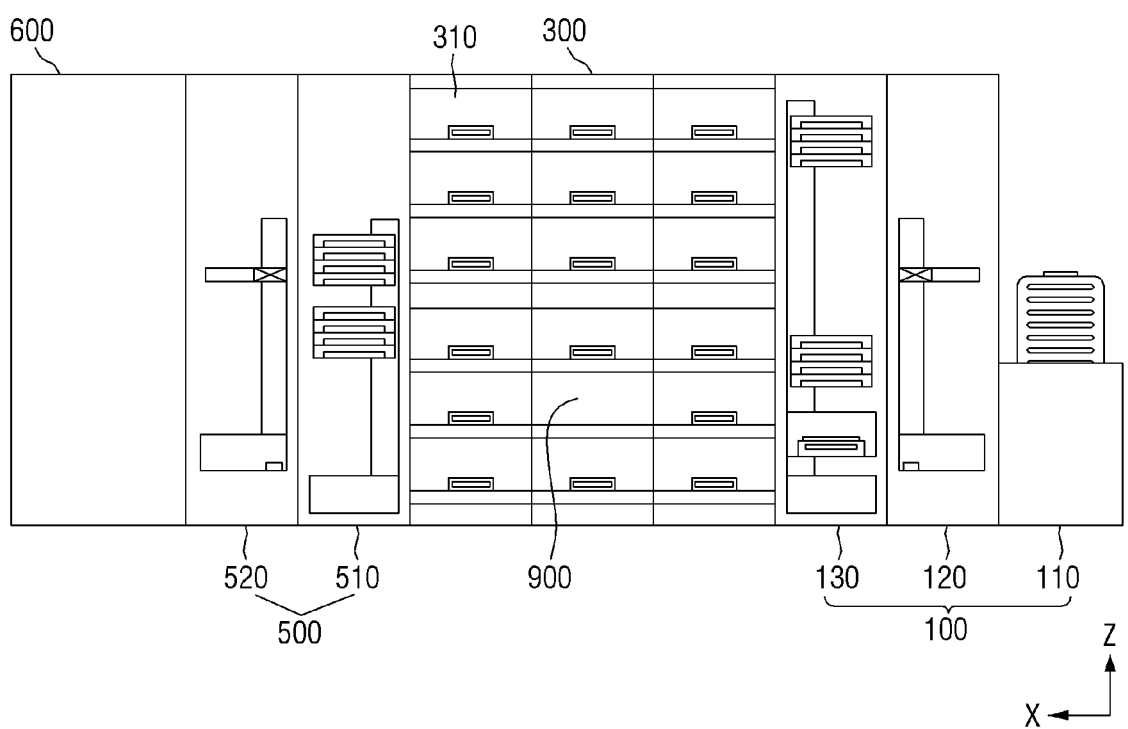
FIG. 12 is a side view illustrating the substrate processing apparatus according to some embodiments of the present disclosure.

The baking unit 300 may include a plurality of baking chambers 310. The baking chambers 310 of the baking unit 300 may be continuously arranged along the first direction X and may be stacked and arranged along the third direction Z. Although it is illustrated in FIGS. 2 and 12 that three baking chambers 310 are arranged along the first direction X and six baking chambers 310 are stacked along the third direction Z, the embodiment is not limited thereto. The number of baking chambers 310 arranged in the first direction X and the third direction Z may be variously changed according to embodiments.

The baking chamber 310 may have a cooling plate or a heating plate. The cooling plate may be provided with a cooling means such as cooling water and a thermoelectric element. The heating plate may be provided with a heating means such as a heating wire and a thermoelectric element. Some of the plurality of baking chambers 310 may include only a cooling plate, and the other baking chambers 310 may include only a heating plate. The present invention is not limited thereto. In an embodiment, some of the plurality of baking chambers 310 may include only a cooling plate, some of the baking chambers 310 may include only a heating plate, and one baking chamber 310 may include both a cooling plate and a heating plate.

The transfer unit 400 may be arranged in parallel with the first buffer module 130 and a second buffer module 510 in the first direction X. A processing unit robot and a guide rail may be arranged in the transfer unit 400. The transfer unit 400, when viewed in a plan view, may have a rectangular shape. The processing unit robot may transfer the substrate W among the first buffer module 130, the coating unit 210, the develop unit 220, the baking unit 300, and the second buffer module 510. The guide rail may extend in the first direction X. The guide rail may guide the processing unit robot to move linearly in the first direction X.

The spin unit 200, the transfer unit 400, and the baking unit 300 may be arranged along the second direction Y. For example, the coating unit 210 and the develop unit 220 may be arranged to face the baking unit 300 with the transfer unit 400 interposed therebetween.

The interface unit 500 may transfer the substrate W between the exposure unit 600 and the processing unit 150 including the spin unit 200, the baking unit 300, and the transfer unit 400. The interface unit 500 may include the second buffer module 510 and an interface robot 520.

The interface unit 500 may temporarily store the substrate W between the processing unit 150 and the exposure unit 600. The interface unit 500 may control the temperature of the substrate W. For example, the interface unit 500 may lower the temperature of the substrate W by supporting the substrate W with a plate (e.g., a cold plate). In an embodiment, the interface unit 500 may increase the temperature of the substrate W by supporting the substrate W with a plate (e.g., a hot plate).

The second buffer module 510 may temporarily store the substrate W. The second buffer module 510 may include a plurality of chambers. The plurality of chambers may include a first buffer chamber and a second buffer chamber accommodating the substrate W.

The first buffer chamber may temporarily store the substrate W transferred from the processing unit 150 to the exposure unit 600. For example, the first buffer chamber may temporarily store the substrate W transferred from the coating unit 210 to the exposure unit 600.

The second buffer chamber may temporarily store the substrate W transferred from the exposure unit 600 to the processing unit 150. For example, the second buffer chamber may temporarily store the substrate W transferred from the exposure unit 600 to the baking unit 300.

A form (i.e., a configuration) in which the first buffer chamber and the second buffer chamber are arranged in the second buffer module 510 may be modified according to embodiments. For example, the first buffer chamber and the second buffer chamber may be stacked in the third direction Z in the second buffer module 510. In an embodiment, the second buffer chamber may be arranged on the first buffer chamber. In an embodiment, the second buffer chamber may be arranged under the first buffer chamber.

In an embodiment, the first buffer chamber and the second buffer chamber may be arranged side by side in the first direction X or the second direction Y. In this case, a plurality of first buffer chambers may be stacked to form a first buffer tower, and a plurality of second buffer chambers may be stacked to form a second buffer tower. In an embodiment, the first buffer tower and the second buffer tower may be arranged side by side in the first direction X or the second direction Y.

The second buffer module 510 may include a chamber that does not accommodate the substrate W. For example, when the interface unit 500 receives a substrate from the transfer unit 400, the substrate may be temporarily stored in the first buffer chamber or the second buffer chamber, and then, the substrate temporarily stored may be transferred from one of the first and second buffer chambers to the chamber in which the first humidity control unit 700 is disposed. The first humidity control unit 700 may be disposed in the chamber of the second buffer module 510. In an embodiment, the chamber of the second buffer module 510 may be configured to serve as the first humidity control unit 700. This will be described in detail below.

The interface robot 520 may transfer the substrate W between the second buffer module 510 and the exposure unit 600.

The substrate W on which a photoresist film is formed may be irradiated with light by the exposure unit 600 (i.e., an exposure or a photolithography exposure) such as a stepper and a scanner so that a circuit pattern is formed on the substrate W. The exposure unit 600 may radiate extreme ultraviolet (EUV).

The first humidity control unit 700 may control the amount of moisture to which the substrate W is exposed when the substrate W passes through the first humidity control unit 700. Specifically, the first humidity control unit 700 may supply vapor to increase the total amount of moisture to which the substrate W is exposed in the first humidity control unit 700. The first humidity control unit 700 may be referred to as a humidification unit.

In some embodiments, the first humidity control unit 700 may be arranged in the second buffer module 510 of the interface unit 500. In an embodiment, the first humidity control unit 700 may be arranged in the plurality of chambers of the second buffer module 510. In an embodiment, the first humidity control unit 700 may be stacked with the first buffer chamber and the second buffer chamber of the second buffer module 510 in the third direction Z. For example, the first humidity control unit 700 may be arranged between the first buffer chamber and the second buffer chamber of the second buffer module 510 in the first direction X or the second direction Y.

In this case, the first humidity control unit 700 may control the total amount of moisture in an ambient to which the substrate W provided from the spin unit 200 to the exposure unit 600 is exposed. Compared to before the substrate W passes through the first humidity control unit 700, the amount of moisture to which the substrate W is exposed may sharply increase when the substrate W passes through the first humidity control unit 700. In an embodiment, a substrate temporarily stored in the first and second buffer chambers of the second buffer module 510 may be transferred to the first humidity control unit 700, and a photoresist film on the substrate may be exposed to vapors in the first humidity control unit 700. After the substrate with the photoresist film is exposed to the vapor in the first humidity control unit 700 for a predetermined time, the substrate may be transferred from the first humidity control unit 700 to the exposure unit 600.

In some embodiments, the substrate W coated with a metal photoresist may be exposed to the amount of moisture increased in the first humidity control unit 700. The reactivity of the metal photoresist of the substrate W exposed to moisture may be improved. Compared to the substrate W that has not passed through the first humidity control unit 700 and is not exposed to the increased amount of moisture, the exposure unit 600 may form a circuit pattern on the substrate W provided from the first humidity control unit 700 with a small amount of energy.

In addition, when the substrate W coated with the metal photoresist is exposed to the amount of moisture increased in the first humidity control unit 700, a deviation in critical dimension (CD) may be reduced by saturating the amount of moisture to which the metal photoresist is exposed.

The first humidity control unit 700 will be described in detail below with reference to FIGS. 4 to 7.

The transfer speed control unit 800 may control the speed at which the index robot 120, the transfer unit 400, and the interface robot 520 transfer the substrate W in the substrate processing apparatus 1. For example, the transfer speed control unit 800 may control the transfer speed of the substrate W when the substrate W is transferred from the spin unit 200 to the baking unit 300 through the transfer unit 400. The transfer speed control unit 800 will be described in detail below with reference to FIG. 7.

Figure 4:
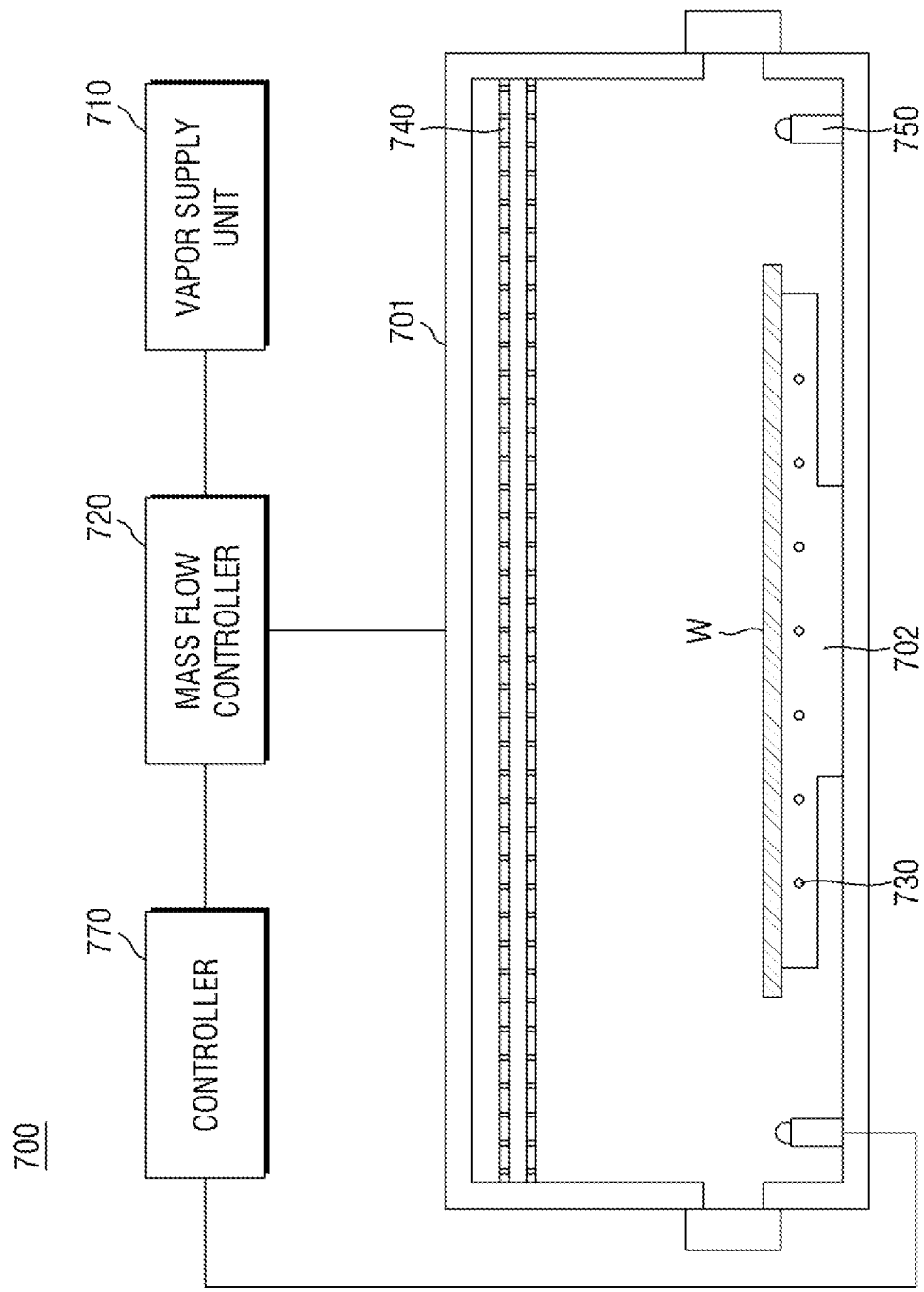
FIG. 4 is a view illustrating a humidity control unit according to some embodiments of the present disclosure.
Figure 5:
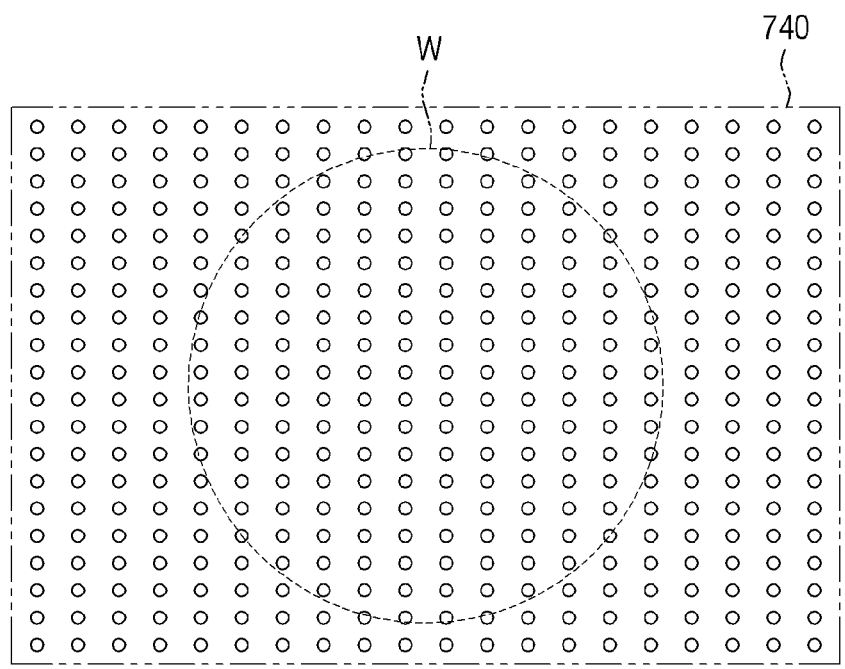
FIG. 5 is a plan view illustrating a punched plate and a substrate of FIG. 4.

FIG. 4 is a view illustrating a humidity control unit according to some embodiments of the present disclosure. FIG. 5 is a plan view illustrating the punched plate and substrate of FIG. 4.

Referring to FIGS. 4 and 5, the first humidity control unit 700 may include a chamber 701, a substrate support unit 702, a vapor supply unit 710, a mass flow controller 720, a temperature control unit 730, a punched plate 740, and a humidity sensor 750. The first humidity control unit 700 may supply vapor to increase the amount of moisture to which the substrate W is exposed.

The chamber 701 may define an internal space in which the substrate W is accommodated.

The substrate support unit 702 may be disposed on a lower surface of the chamber 701 to support the substrate W.

The vapor supply unit 710 may store vapor provided to increase the humidity of a space to which the substrate W is exposed, and may supply the vapor into the chamber 701.

The mass flow controller 720 may control a flow rate of vapor supplied from the vapor supply unit 710.

The temperature control unit 730 may control a temperature of the space to which the substrate W is exposed. The temperature control unit 730 may be disposed inside the substrate support unit 702. The temperature control unit 730 may adjust the temperature of the space to which the substrate W is exposed according to a target relative humidity. For example, when the amount of supplied vapor is constant and the relative humidity is increased, the temperature control unit 730 may lower the temperature of the space to which the substrate W is exposed. In an embodiment, when the amount of supplied vapor is constant and the relative humidity of the space to which the substrate W is exposed is reduced, the temperature control unit 730 may increase the temperature of the space to which the substrate W is exposed. The temperature control unit 730 may include a plate that heats the substrate W.

The punched plate 740 may allow the vapor to be uniformly supplied to the substrate W. The punched plate 740 is disposed above an upper surface of the substrate W to overlap the substrate W. The punched plate 740 may include a plate body and a plurality of holes penetrating the plate body. Vapors may be injected onto the substrate W through the holes.

The humidity sensor 750 may sense the internal humidity of the chamber 701. In an embodiment, the internal humidity measured by the humidity sensor 750 may be an absolute humidity or a relative humidity. The humidity sensor 750 may provide the sensed internal humidity of the chamber 701 to a controller 770. The controller 770 may control the amount of vapor supplied into the chamber 701 through the mass flow controller 720 based on the internal humidity of the chamber 701 provided from the humidity sensor 750, and may control the relative humidity of the space (e.g., chamber 701) to which the substrate W is exposed through the temperature control unit 730.

Figure 6:
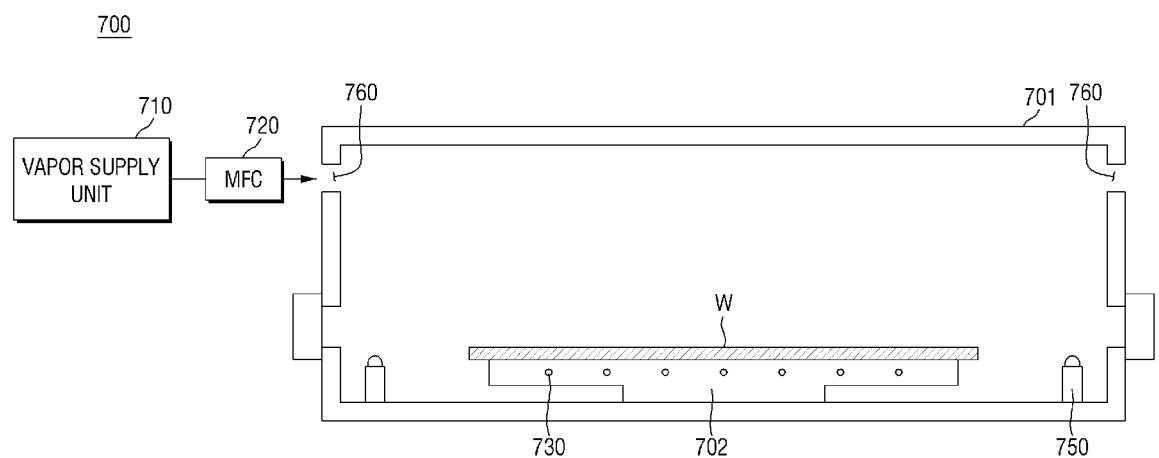
FIG. 6 is a side view illustrating a humidity control unit according to some embodiments of the present disclosure.

FIG. 6 is a side view illustrating a humidity control unit according to some embodiments of the present disclosure. For convenience of description, points different from those described with reference to FIGS. 4 and 5 will be mainly described.

Referring to FIG. 6, the first humidity control unit 700 may include a vapor entry hole 760 provided at the chamber 701. Unlike FIGS. 4 and 5 in which the substrate W is provided with the vapor having passed through the punched plate in the first humidity control unit 700, the substrate W may be provided with vapor that is injected into the chamber 701 through the vapor entry hole 760 of the first humidity control unit 700 as illustrated in FIG. 6.

Figure 7:
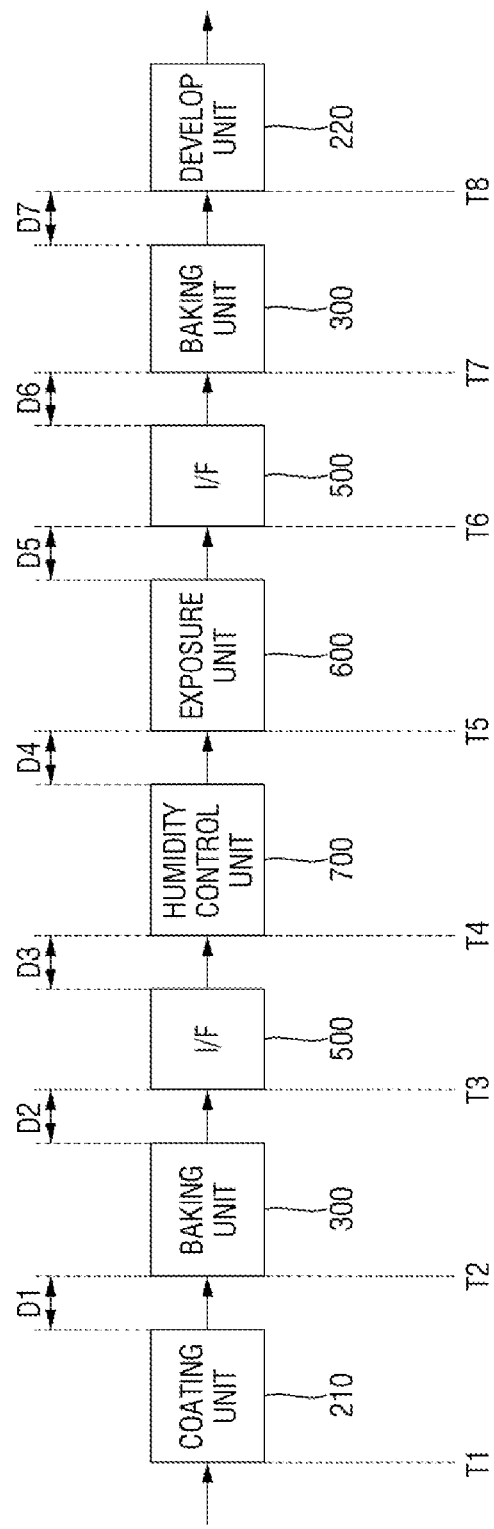
FIG. 7 is a view illustrating the operation of a transfer speed control unit of a substrate processing apparatus according to some embodiments of the present disclosure.

FIG. 7 is a view illustrating the operation of a transfer speed control unit of a substrate processing apparatus according to some embodiments of the present disclosure.

Referring to FIGS. 2 and 7, the transfer speed control unit 800 may control the transfer speed of the substrate W based on the time point at which the substrate W is provided to each unit and a distance over which the substrate W is transferred between two units associated with the transfer of the substrate W.

The substrate W is provided to the coating unit 210 at a time point T1 so that a photoresist film is coated on the substrate W. The substrate W is transferred from the coating unit 210 to the baking unit 300, and a travelling distance of the substrate W between the coating unit 210 and the baking unit 300 is a distance D1.

The transfer speed control unit 800 may simulate a time point T2 at which the substrate W is provided to the baking unit 300 based on the time point T1 at which the substrate W is provided to the coating unit 210. The transfer speed control unit 800 may calculate a distance D1 at which the substrate W is transferred from the coating unit 210 to the baking unit 300 to control the speed at which the transfer unit 400 transfers the substrate W. At this time, the transfer speed control unit 800 may calculate a distance between the plurality of coating chambers 211 of the coating unit 210 providing the substrate W and the plurality of baking chambers 310 of the baking unit 300 receiving the substrate W. In addition, the transfer speed control unit 800 may calculate the distance D1 in consideration of the baking chamber 310 that is unavailable among the plurality of baking chambers 310, and may simulate the time between the time point T1 and the time point T2.

Next, the substrate W may be provided to the baking unit 300 at the time point T2 so that the coated photoresist film may be soft-baked. The substrate W is transferred from the baking unit 300 to the interface unit 500 at a time point T3. A travelling distance of the substrate W between the baking unit 300 and the interface unit 500 is a distance D2.

The transfer speed control unit 800 may simulate the time point T3 at which the substrate W is provided to the interface unit 500 based on the time point T2 at which the substrate W is provided to the baking unit 300. The transfer speed control unit 800 may control the speed at which the transfer unit 400 transfers the substrate W by calculating the distance D2 at which the substrate W is transferred from the baking unit 300 to the interface unit 500. In this case, the transfer speed control unit 800 may calculate a distance between the plurality of baking chambers 310 of the baking unit 300 providing the substrate W and the plurality of chambers of the second buffer module 510 included in the interface unit 500 receiving the substrate W. In addition, the transfer speed control unit 800 may calculate the distance D2 in consideration of an unavailable chamber among the plurality of chambers of the second buffer module 510, and may simulate the time between the time point T2 and the time point T3.

Next, the substrate W may be transferred from the interface unit 500 to the first humidity control unit 700 at a time point T4. A travelling distance of the substrate W between the interface unit 500 and the first humidity control unit 700 is a distance D3.

The transfer speed control unit 800 may simulate the time point T4 at which the substrate W is provided to the first humidity control unit 700 based on the time point T3 at which the substrate W is provided to the interface unit 500. The transfer speed control unit 800 may calculate the distance D3 at which the substrate W is transferred from the interface unit 500 to the first humidity control unit 700 to control the speed at which the transfer unit 400 transfers the substrate W. In this case, the transfer speed control unit 800 may calculate a distance between the plurality of chambers of the second buffer module 510 included in the interface unit 500 providing the substrate W and the chamber 701 of the first humidity control unit 700 receiving the substrate W. In addition, the transfer speed control unit 800 may calculate the distance D3 in consideration of an unavailable chamber among the chambers 701 of the first humidity control unit 700, and may simulate the time between the time points T3 and T4.

Next, after the substrate W is exposed to the amount of moisture increased in the first humidity control unit 700, the substrate W may be transferred from the first humidity control unit 700 to the exposure unit 600 at a time point T5. A travelling distance of the substrate W between the first humidity control unit 700 and the exposure unit 600 is a distance D4. Light may be irradiated to the photoresist film coated on the substrate W in the exposure unit 600.

The transfer speed control unit 800 may simulate the time point T5 at which the substrate W is provided to the exposure unit 600 based on the time point T4 at which the substrate W is provided to the first humidity control unit 700. The transfer speed control unit 800 may calculate the distance D4 at which the substrate W is transferred from the first humidity control unit 700 to the exposure unit 600 to control the speed at which the transfer unit 400 transfers the substrate W. In this case, the transfer speed control unit 800 may calculate a distance between the chamber 701 of the first humidity control unit 700 providing the substrate W and the chamber of the exposure unit 600 receiving the substrate W. In addition, the transfer speed control unit 800 may calculate the distance D4 in consideration of the unavailable chamber among the chambers 701 of the first humidity control unit 700, and may simulate the time between the time points T4 and T5.

Next, the substrate W may be transferred from the exposure unit 600 to the interface unit 500 at a time point T6. A travelling distance of the substrate W between the exposure unit 600 and the interface unit 500 is a distance D5.

The transfer speed control unit 800 may simulate the time point T6 at which the substrate W is provided to the interface unit 500 based on the time point T5 at which the substrate W is provided to the exposure unit 600. The transfer speed control unit 800 may control the speed at which the transfer unit 400 transfers the substrate W by calculating the distance D5 at which the substrate W is transferred from the exposure unit 600 to the interface unit 500. At this time, the transfer speed control unit 800 may calculate a distance between the chamber of the exposure unit 600 providing the substrate W and the plurality of chambers of the second buffer module 510 included in the interface unit 500 receiving the substrate W. In addition, the transfer speed control unit 800 may calculate the distance D5 in consideration of the unavailable chamber among the plurality of chambers of the second buffer module 510, and may simulate the time between the time points T5 and T6.

Next, the substrate W may be transferred from the interface unit 500 to the baking unit 300 at a time point T7. A travelling distance of the substrate W between the interface unit 500 and the baking unit 300 is a distance D6. In the baking unit 300, the substrate W may be subjected to a hard bake process.

The transfer speed control unit 800 may simulate the time point T7 at which the substrate W is provided to the baking unit 300 based on the time point T6 at which the substrate W is provided to the interface unit 500. The transfer speed control unit 800 may control the speed at which the transfer unit 400 transfers the substrate W by calculating the distance D6 at which the substrate W is transferred from the interface unit 500 to the baking unit 300. In this case, the transfer speed control unit 800 may calculate a distance between the plurality of chambers of the second buffer module 510 included in the interface unit 500 providing the substrate W and the plurality of baking chambers 310 of the baking unit 300 receiving the substrate W. In addition, the transfer speed control unit 800 may calculate the distance D6 in consideration of the unavailable chamber among the plurality of chambers of the second buffer module 510, and may simulate the time between the time points T6 and T7.

Next, the substrate W may be transferred from the baking unit 300 to the develop unit 220 at a time point T8. A travelling distance of the substrate W between the baking unit 300 and the develop unit 220 is a distance D7. In the develop unit 220, the substrate W may be irradiated with light, and the hard-baked photoresist film may be developed.

The transfer speed control unit 800 may simulate the time point T8 at which the substrate W is provided to the develop unit 220 based on the time point T7 at which the substrate W is provided to the baking unit 300. The transfer speed control unit 800 may control the speed at which the transfer unit 400 transfers the substrate W by calculating the distance D7 at which the substrate W is transferred from the baking unit 300 to the develop unit 220. In this case, the transfer speed control unit 800 may calculate a distance between the plurality of baking chambers 310 of the baking unit 300 providing the substrate W and the plurality of developing chambers 221 of the develop unit 220 receiving the substrate W. In addition, the transfer speed control unit 800 may calculate the distance D7 in consideration of an unavailable chamber among the plurality of developing chambers 221, and may simulate the time between the time points T7 and T8.

The transfer speed control unit 800 may calculate each transfer time between the time points T1 to T8 and determine whether the substrate W can be processed in a steady flow in each unit.

The transfer speed control unit 800 may calculate each transfer distance D1 to D7 of the substrate W to compensate for a difference in the distance so that the transfer unit 400 may equalize the transfer time of the substrate W. For example, when D1 is greater than D2, the transfer speed control unit 800 may control the transfer unit 400 to transfer the substrate W the distance D1 at a higher transfer speed than that when the transfer unit 400 transfers the substrate W the distance D2.

The transfer speed control unit 800 may control the transfer speed of the substrate W depending on the distance over which the substrate W is transferred, thereby preventing a delay from occurring after the process for the substrate W is completed in a specific unit in the substrate processing apparatus 1. For example, after an exposure process is performed on the substrate W in the exposure unit 600, the substrate W may be transferred to the baking unit 300. However, when a process on another substrate W is performed in the baking unit 300, the substrate W may not be transferred between the exposure unit 600 and the baking unit 300 and stagnation may occur.

When the substrate W is not transferred in a specific section and is stagnant, the plurality of substrates W may be respectively exposed to different environments for different durations, thereby reducing process yield. Accordingly, by controlling the transfer speed of the substrate W, it is possible to reduce variations in the time during which the substrate W is exposed to different environments in the substrate processing apparatus 1. Accordingly, the transfer speed control unit 80 controlling the transfer speed of the substrate W according to the distance over which the substrate W is transferred, may uniformize the transfer time of the plurality of substrates W.

Although it is illustrated in FIG. 7 that the substrate W is processed sequentially in the coating unit 210, the baking unit 300, the interface unit 500, the first humidity control unit 700, the exposure unit 600, the interface unit 500, the baking unit 300, and the develop unit 220, the embodiment is not limited thereto. For example, the substrate W may be directly provided to the interface unit 500 without going through the baking unit 300 after being processed in the coating unit 210.

Figure 8:
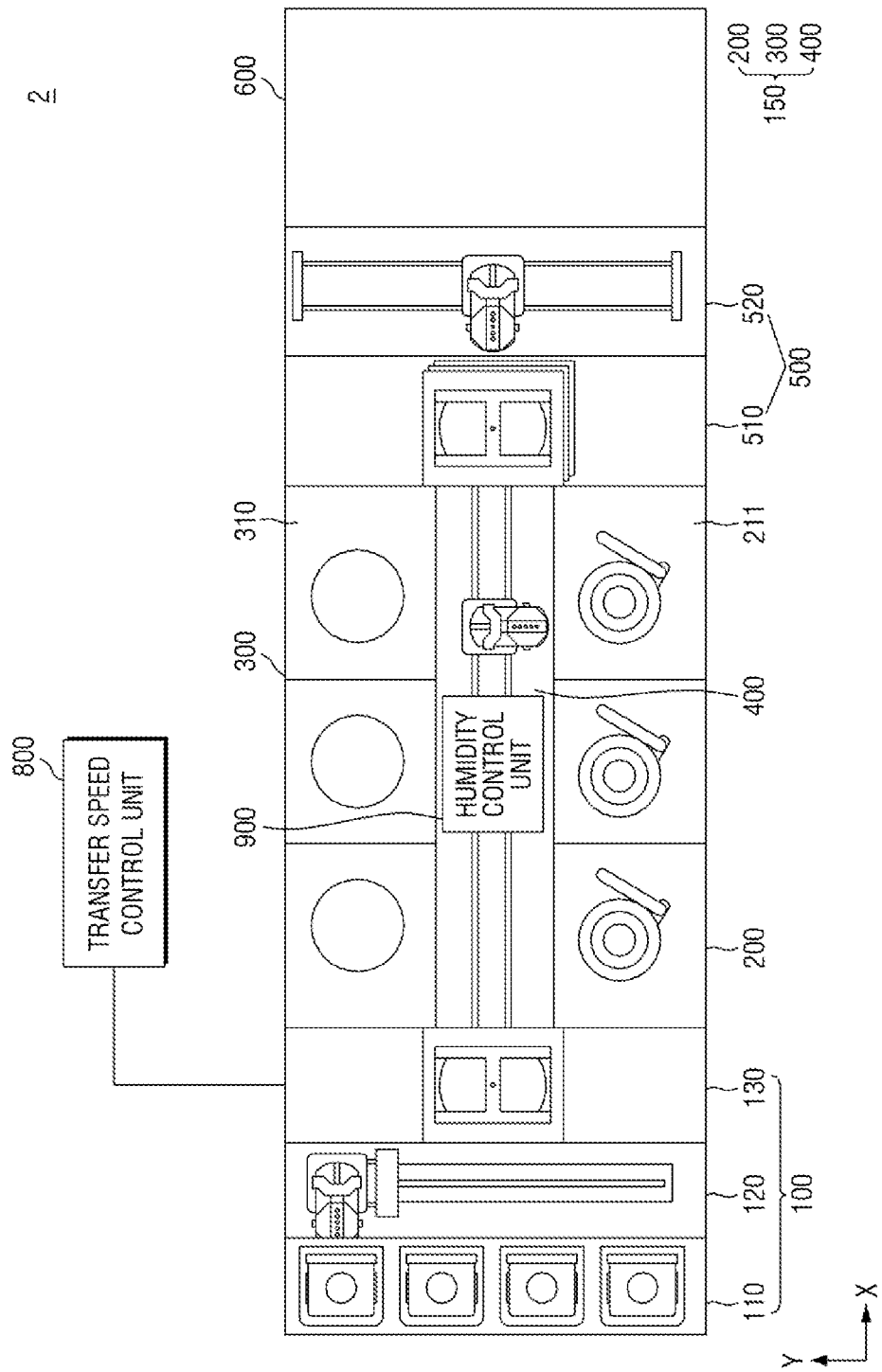
FIG. 8 is a plan view illustrating a substrate processing apparatus according to some embodiments of the present disclosure.
Figure 9:
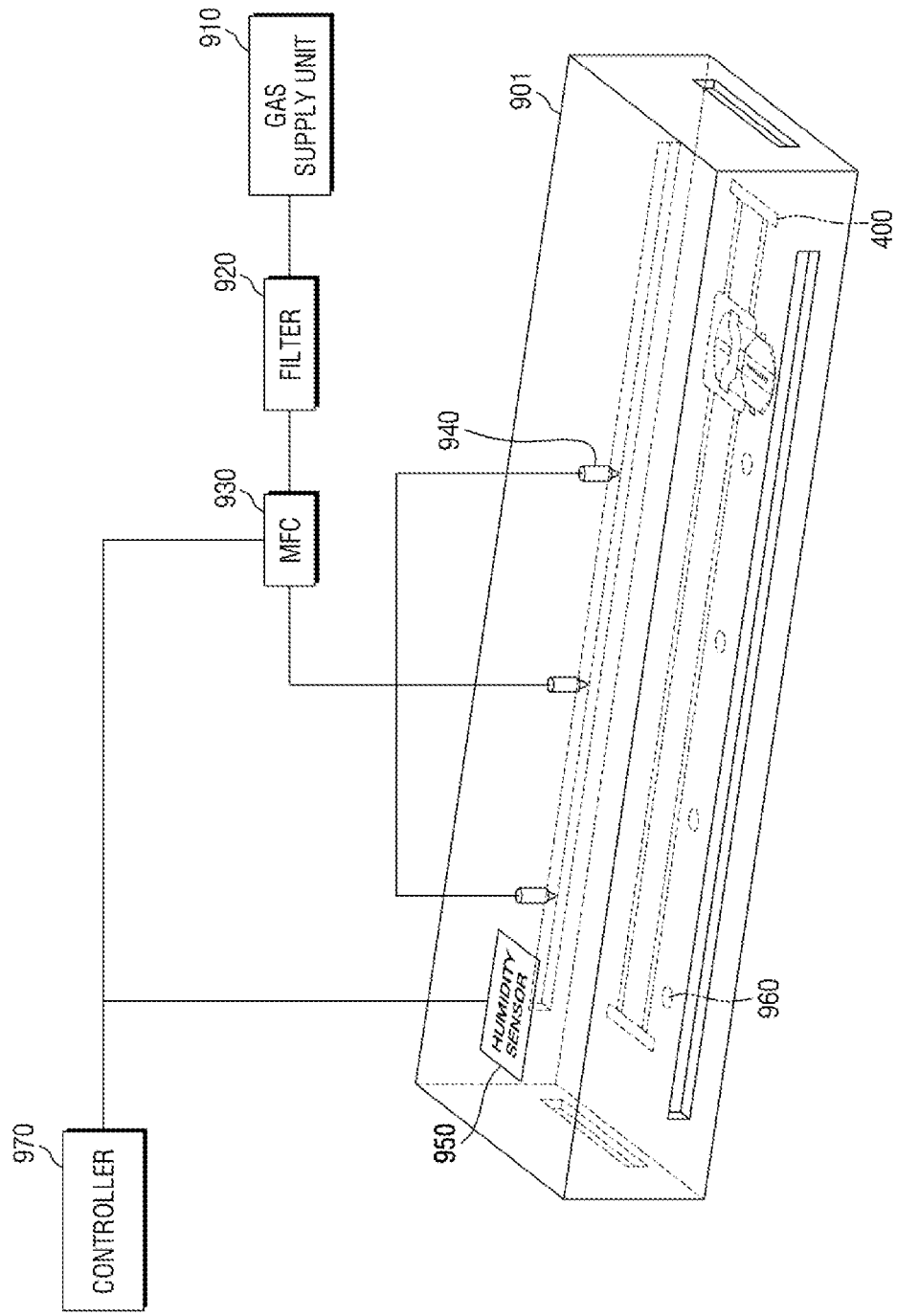
FIG. 9 is a view illustrating the transfer unit and humidity control unit of FIG. 8.
Figure 10:
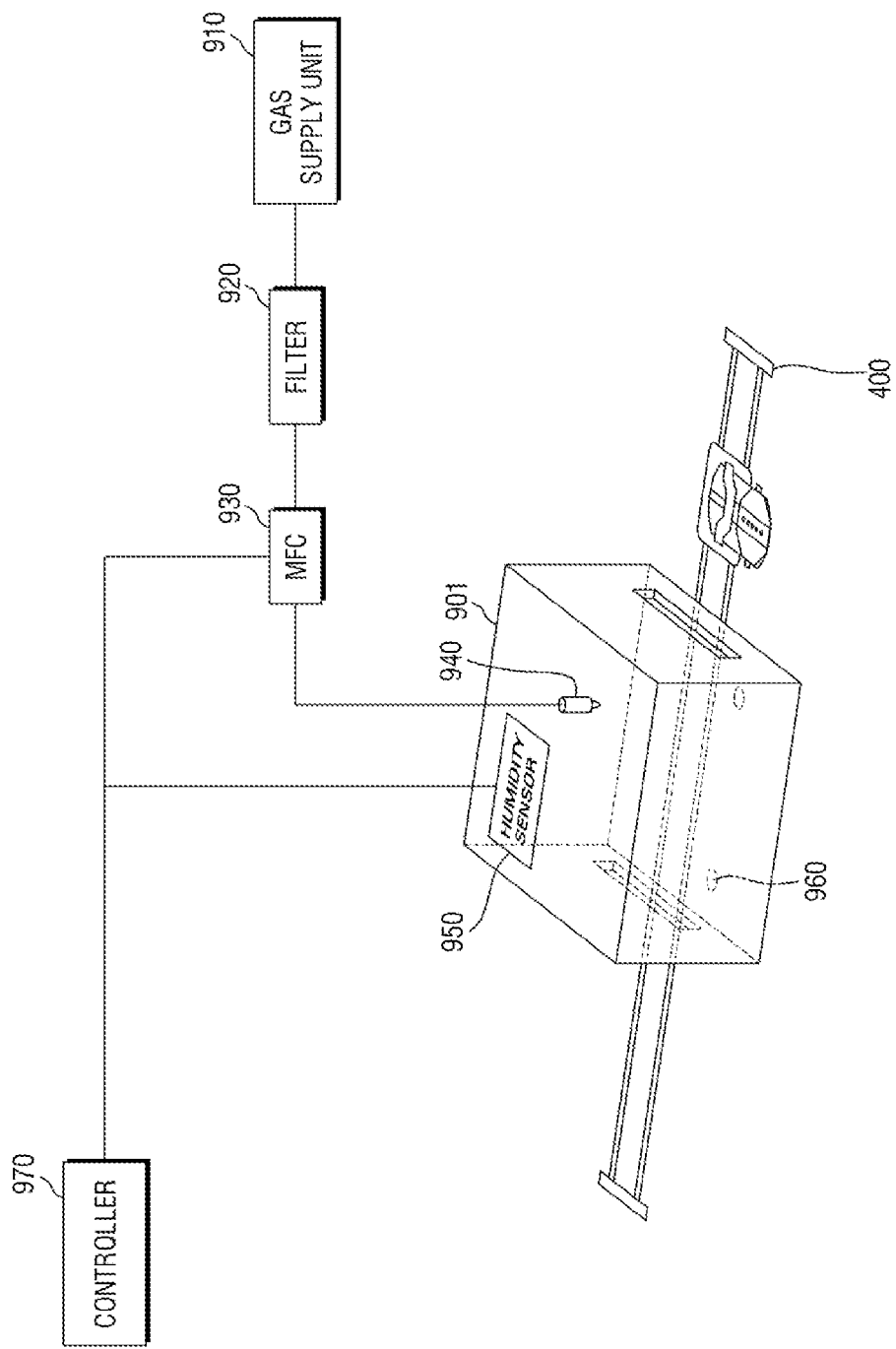
FIG. 10 is a view illustrating a transfer unit and a humidity control unit according to another embodiment.

FIG. 8 is a plan view illustrating a substrate processing apparatus according to some embodiments of the present disclosure. FIG. 9 is a view illustrating the transfer unit and humidity control unit of FIG. 8. FIG. 10 is a view illustrating a transfer unit and a humidity control unit according to another embodiment. For convenience of description, points different from those described with reference to FIGS. 2 to 4 will be mainly described.

Referring to FIGS. 8 and 9, a substrate processing apparatus 2 may include a second humidity control unit 900 (i.e., a dehumidifier) including a transfer unit 400.

The second humidity control unit 900 may include an enclosure 901, a gas supply unit 910, a filter 920, a mass flow controller 930, a nozzle 940, a humidity sensor 950, a gas exhaust hole 960, and a controller 970.

The gas supply unit 910 may store a gas provided to reduce the humidity of a space to which the substrate W is exposed, and may supply the gas into the enclosure 901. In some embodiments, the gas supply unit 910 may supply an inert gas or clean dry air (CDA) into the enclosure 901. Since the inert gas (e.g., N2) provided by the gas supply unit 910 does not contain moisture, the amount of moisture to which the substrate W is exposed may be reduced. Since the CDA provided by the gas supply unit 910 has a high dew point, the amount of moisture to which the substrate W is exposed may be controlled to be low.

The filter 920 may filter impurities included in the gas provided from the gas supply unit 910. For example, the filter 920 may include a fan filter unit (FFU).

The mass flow controller 930 may control a flow rate of the gas supplied into the enclosure 901.

The nozzle 940 may inject the gas supplied from the gas supply unit 910 into the enclosure 901. Although it is illustrated in FIG. 10 that the nozzle 940 injects the gas into the enclosure 901, the embodiment is not limited thereto. For example, a component for injecting the gas into the enclosure 901 may include various types of components, such as a slit, a hole, and a showerhead rather than a nozzle.

The humidity sensor 950 may sense the humidity inside the enclosure 901. The humidity sensor 750 may provide the sensed internal humidity of the enclosure 901 to the controller 970.

The gas exhaust hole 960 may exhaust the gas inside the enclosure 901. Since the gas exhaust hole 960 exhausts the gas inside the enclosure 901, diffusion of the gas inside the enclosure 901 to the outside of the second humidity control unit 900 may be minimized. The gas exhaust hole 960 may include various types of components, such as a slit, a hole, and a duct.

The controller 970 may control the amount of gas supplied into the enclosure 901 through the mass flow controller 930 based on the internal humidity of the enclosure 901 provided from the humidity sensor 950. For example, when determining that the internal humidity of the enclosure 901 provided from the humidity sensor 950 is lower than a threshold humidity, the controller 970 may control the mass flow controller 930 to reduce the flow rate of the gas injected into the enclosure 901. In an embodiment, the threshold humidity may be an absolute humidity or a relative humidity. In an embodiment, when determining that the internal humidity of the enclosure 901 provided from the humidity sensor 950 is higher than the threshold humidity, the controller 970 may control the mass flow controller 930 to increase the flow rate of the gas injected into the enclosure 901.

The second humidity control unit 900 may control the amount of amount to which the substrate W is exposed in the substrate processing apparatus 2 without affecting the developed status of the photoresist film on the substrate W. Specifically, the second humidity control unit 900 may supply an inert gas or clean dry air (CDA) to reduce the total amount of moisture in an ambient to which the substrate W is exposed in the substrate processing apparatus 2. For example, when a case in which the substrate processing apparatus 2 includes the second humidity control unit 900 is compared with a case in which the substrate processing apparatus 2 does not include the second humidity control unit 900, the total amount of moisture to which the substrate W passing through the second humidity control unit 900 is exposed in the substrate processing apparatus 2 may be less than the total amount of moisture to which the substrate W not passing through the second humidity control unit 900 is exposed in the substrate processing apparatus. The second humidity control unit 900 may be referred to as a low humidity unit.

In some embodiments, the second humidity control unit 900 may include or may enclose the transfer unit 400. In this case, the second humidity control unit 900 may control the total amount of moisture to which the substrate W provided from an exposure unit 600 to a baking unit 300 is exposed in the substrate processing apparatus 2. In addition, the second humidity control unit 900 may control the total amount of moisture to which the substrate W transferred between a spin unit 200 and the baking unit 300 is exposed in the substrate processing apparatus 2. For example, the total amount of moisture to which the substrate W is exposed in the substrate processing apparatus 2 including the second humidity control unit 900 when the substrate W is transferred between the exposure unit 600 and the baking unit 300 or between the spin unit 200 and the baking unit 300 may be less than the total amount of moisture to which the substrate W is exposed in the substrate processing apparatus that does not include the second humidity control unit 900 when the substrate W is transferred between the exposure unit 600 and the baking unit 300 or between the spin unit 200 and the baking unit 300.

In an embodiment, in a case in which the substrate W is provided from the baking unit 300 to a develop unit 220 of the spin unit 200 by the transfer unit 400 including the second humidity control unit 900, the total amount of moisture to which the substrate W is exposed in the substrate processing apparatus 2 including the second humidity control unit 900 when the substrate W is provided from the baking unit 300 to the develop unit 220 of the spin unit 200 may be less than the total amount of moisture to which the substrate W is exposed when the substrate W is provided from the baking unit 300 to the develop unit 220 of the spin unit 200 by the transfer unit 400.

In an embodiment, the amount of moisture to which the substrate W having passed through the second humidity control unit 900 is exposed in the substrate processing apparatus 2 may be less than the amount of moisture to which the substrate W not passing through the second humidity control unit 900 is exposed.

Referring to FIG. 10, unlike FIG. 9, the second humidity control unit 900 includes or encloses a portion of the transfer unit 400. For example, the second humidity control unit 900 does not include the entire transfer unit 400, and the second humidity control unit 900 may be a partial area through which the processing unit robot of the transfer unit 400 passes. In this case, the substrate W transferred by the transfer unit 400 passes through the second humidity control unit 900, so that the amount of moisture to which the substrate W is exposed is reduced.

Figure 11:
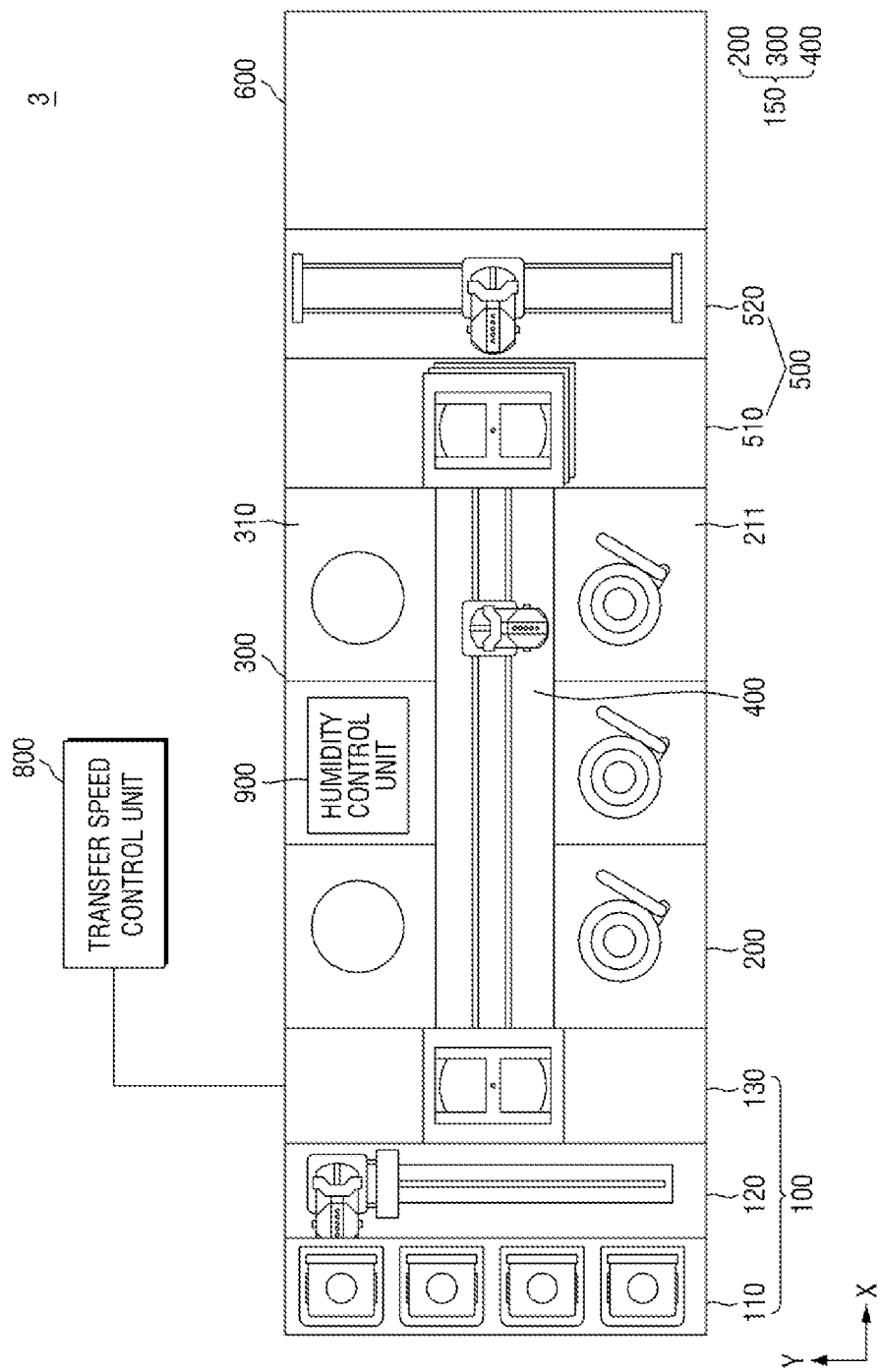
FIG. 11 is a plan view illustrating a substrate processing apparatus according to some embodiments of the present disclosure.
Figure 13:
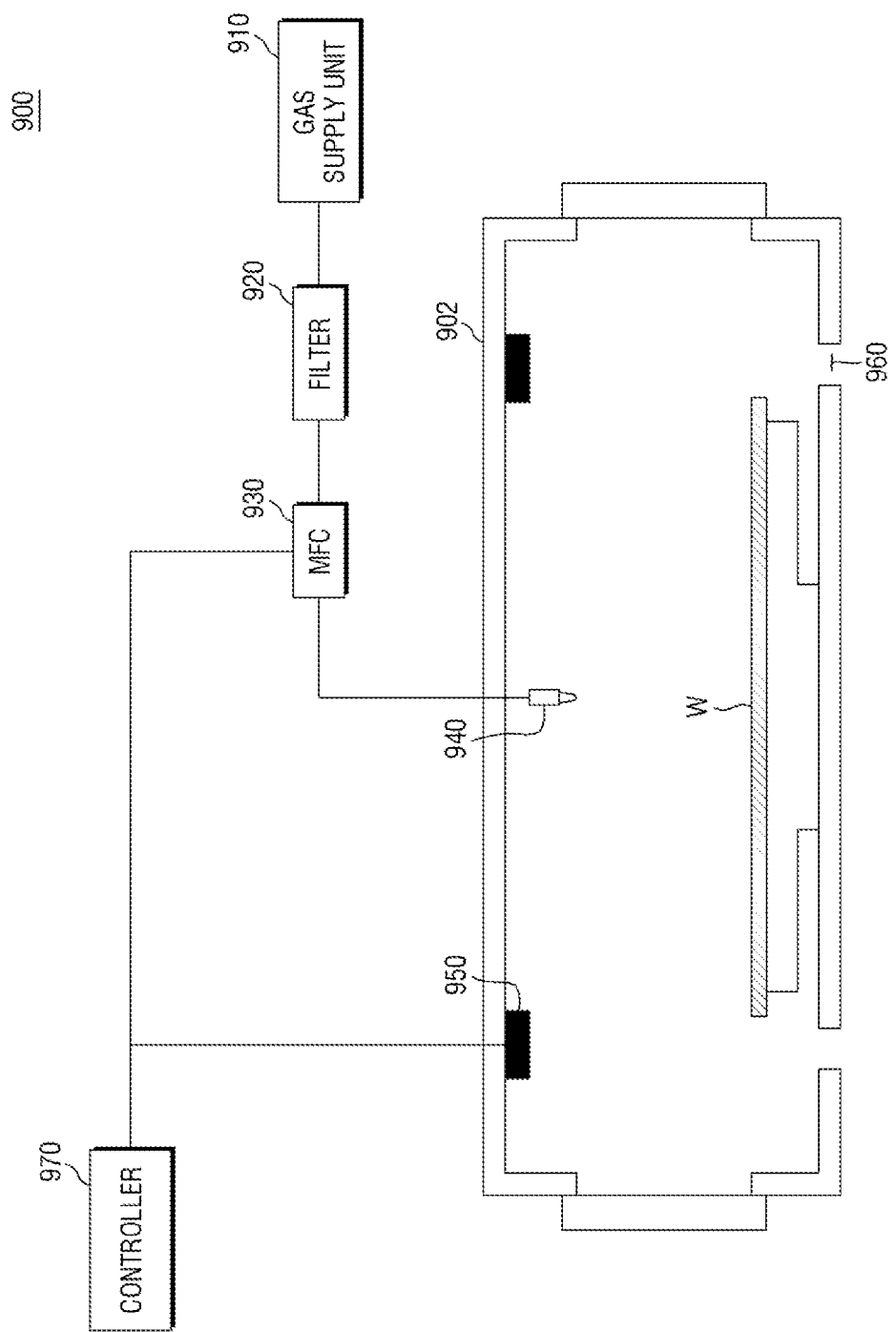
FIG. 13 is a view illustrating the humidity control unit of FIG. 11.

FIG. 11 is a plan view illustrating a substrate processing apparatus according to some embodiments of the present disclosure. FIG. 12 is a side view illustrating the substrate processing apparatus according to some embodiments of the present disclosure. FIG. 13 is a view illustrating the humidity control unit of FIG. 11. For convenience of description, points different from those described with reference to FIGS. 8 to 10 will be mainly described.

Referring to FIGS. 11 to 13, a substrate processing apparatus 3 may include a second humidity control unit 900 disposed inside a baking unit 300.

The baking unit 300 may include a plurality of baking chambers 310. As illustrated in FIG. 12, in the baking unit 300, the plurality of baking chambers 310 may be stacked in the third direction Z to form a total of six layers (i.e., six vertical levels). In addition, in the baking unit 300, the plurality of baking chambers 310 may be continuously arranged in the first direction X.

The second humidity control unit 900 may be stacked together with the plurality of baking chambers 310 and included in the baking unit 300. In an embodiment, the second humidity control unit 900 may be aligned with the plurality of baking chambers 310. For example, the second humidity control unit 900 may be stacked together with the plurality of baking chambers 310. The baking unit 300 may include a blank chamber (i.e., a dummy chamber) in which a separate process is not performed, in addition to the plurality of baking chambers 310 in which the baking process is performed. The second humidity control unit 900 may be disposed in the blank chamber of the baking unit 300. In an embodiment, the blank chamber may be provided in plural.

The second humidity control unit 900 disposed in the baking unit 300 may be variously modified according to embodiments. For example, as illustrated in FIG. 12, the second humidity control unit 900 may be disposed in a second blank chamber in the first direction X and in the second layer in the third direction Z from the lower surface of the substrate processing apparatus 3. In an embodiment, the second humidity control unit 900 may be disposed in one blank chamber for every layer of the baking unit 300. The position and number of the second humidity control units 900 disposed in the baking unit 300 may be changed according to embodiments.

The second humidity control unit 900 may reduce the amount of moisture to which the substrate W is exposed before the substrate W irradiated with light in an exposure unit 600 is subjected to a post-bake process by the baking unit 300. The second humidity control unit 900 may supply an inert gas or CDA to reduce the total amount of moisture to which the substrate W is exposed in the substrate processing apparatus 3.

The second humidity control unit 900 may include a chamber 902, a gas supply unit 910, a filter 920, a mass flow controller 930, a nozzle 940, a humidity sensor 950, a gas exhaust hole 960, and a controller 970.

The chamber 902 may include a blank chamber of the baking unit 300. The chamber 902 may include a shutter (not illustrated). The shutter may open and close the chamber 902 to allow the substrate W to enter and exit the second humidity control unit 900.

Figure 14:
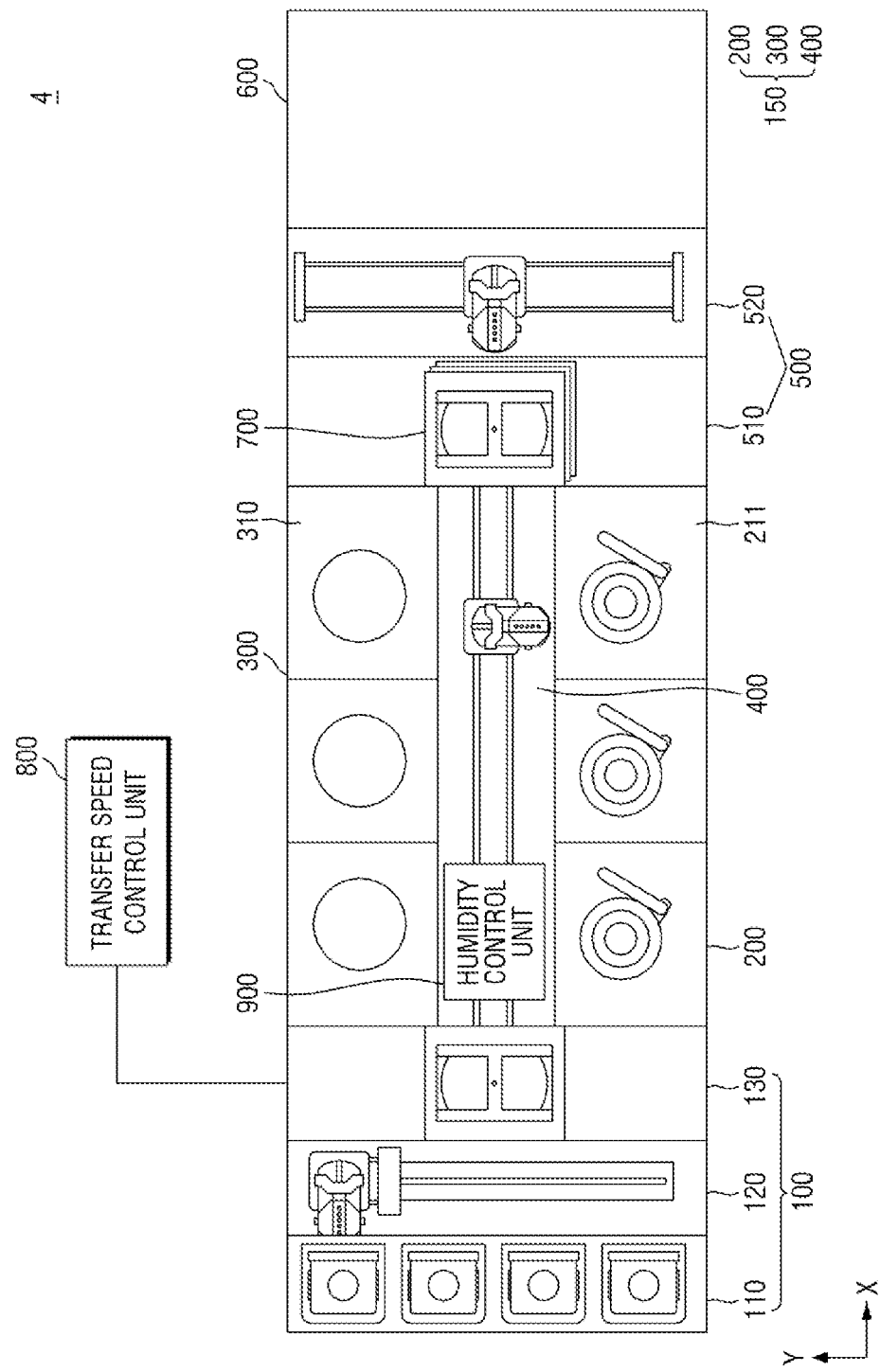
FIG. 14 is a diagram illustrating a substrate processing apparatus according to some embodiments of the present disclosure.

FIG. 14 is a diagram illustrating a substrate processing apparatus according to some embodiments of the present disclosure. For convenience of description, points different from those described with reference to FIGS. 2, 8 and 11 will be mainly described.

Referring to FIG. 14, a substrate processing apparatus 4 may include a first humidity control unit 700 disposed in a second buffer module 510 and a second humidity control unit 900 disposed inside a transfer unit 400.

The first humidity control unit 700 may increase the total amount of moisture to which the substrate W is exposed in the substrate processing apparatus 4 by supplying vapor. By supplying an inert gas or CDA, the second humidity control unit 900 may reduce the total amount of moisture to which the substrate W is exposed in the substrate processing apparatus 4.

In some embodiments, the substrate processing apparatus 4 may coat a photoresist film on the substrate W in a coating unit 210 of a spin unit 200, and may allow the substrate W to pass through the first humidity control unit 700 before the substrate W having been subjected to the soft-bake process in a baking unit 300 is provided to an exposure unit 600. For example, before light is irradiated to the substrate W in the exposure unit 600, the substrate processing apparatus 4 may allow the substrate W to pass through the first humidity control unit 700 to increase the amount of moisture to which the substrate W is exposed.

In some embodiments, the substrate processing apparatus 4 may allow the substrate W to pass through the second humidity control unit 900 before the substrate W irradiated with light in the exposure unit 600 is provided to the baking unit 300. For example, before the substrate W is subjected to the post-bake process in the baking unit 300, the substrate processing apparatus 4 may allow the substrate W to pass through the second humidity control unit 900 to reduce the amount of moisture to which the substrate W is exposed in the substrate processing apparatus 4. In this case, the substrate W may pass through the second humidity control unit 900 included in the transfer unit 400 to reduce the amount of moisture to which the substrate W is exposed in a process of transferring the substrate W provided from the exposure unit 600 to the baking unit 300 through the transfer unit 400.

Figure 15:
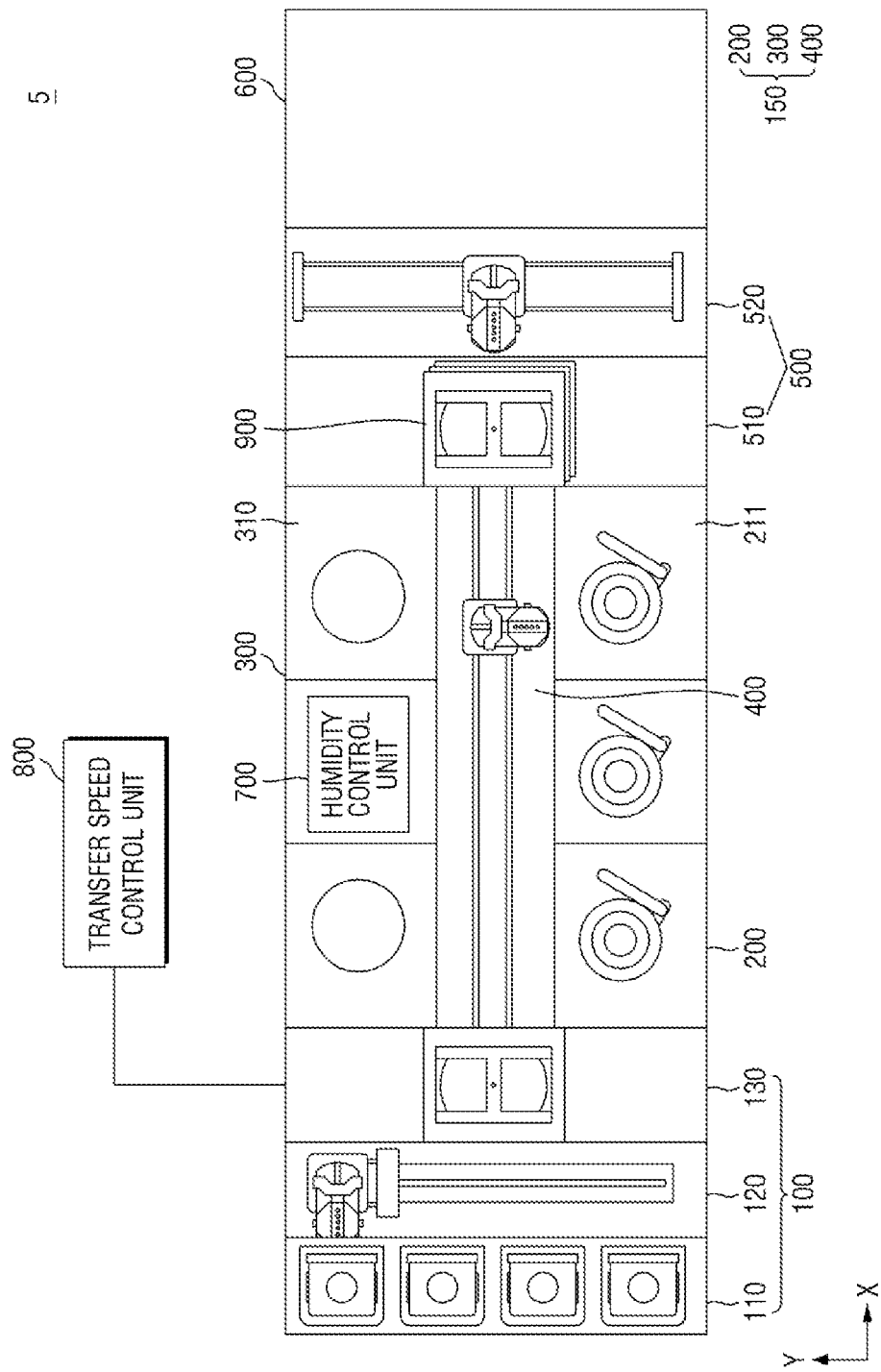
FIGS. 15 and 16 are diagrams illustrating a substrate processing apparatus according to some embodiments of the present disclosure.
Figure 16:
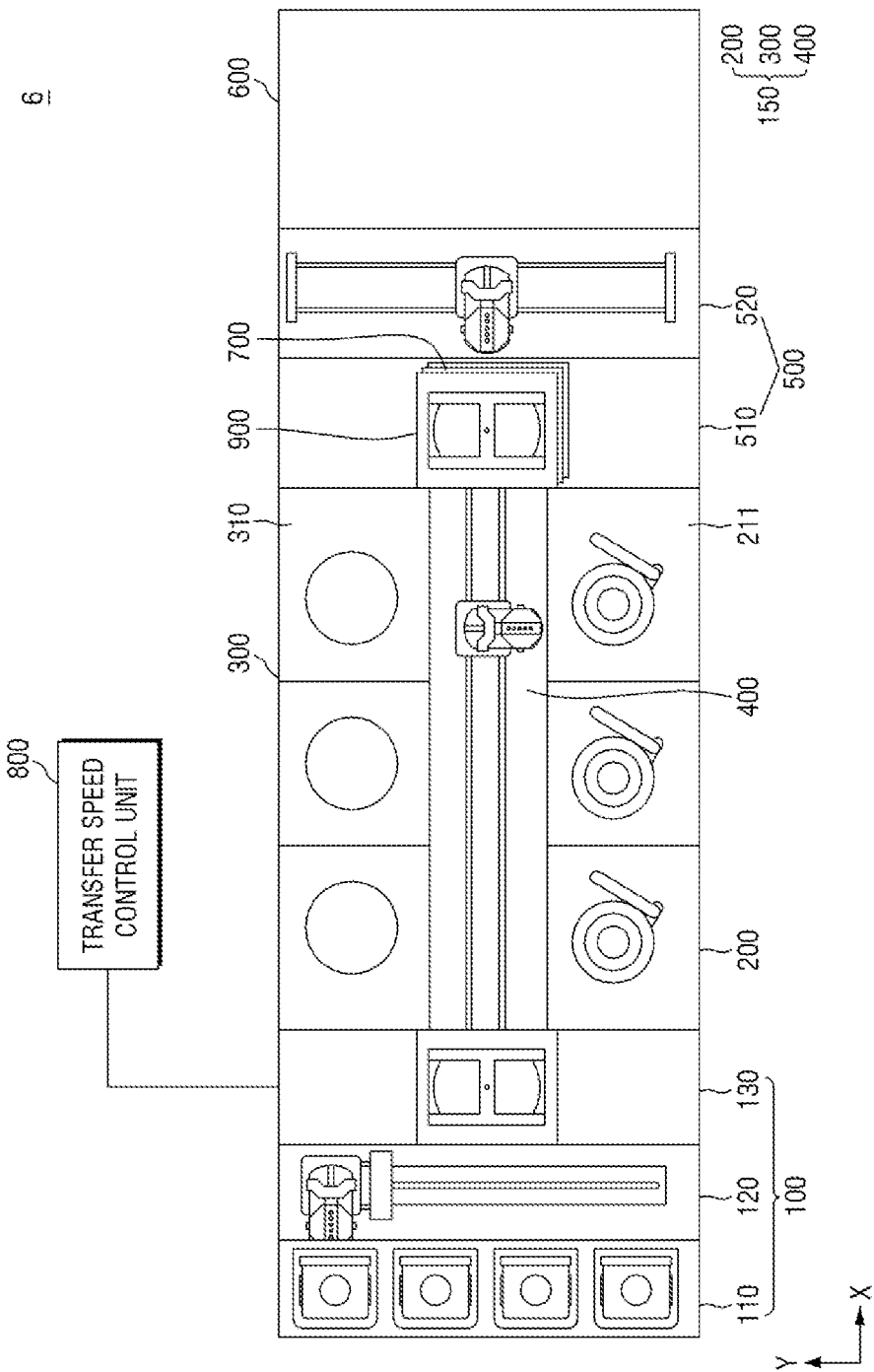
Figure 17:
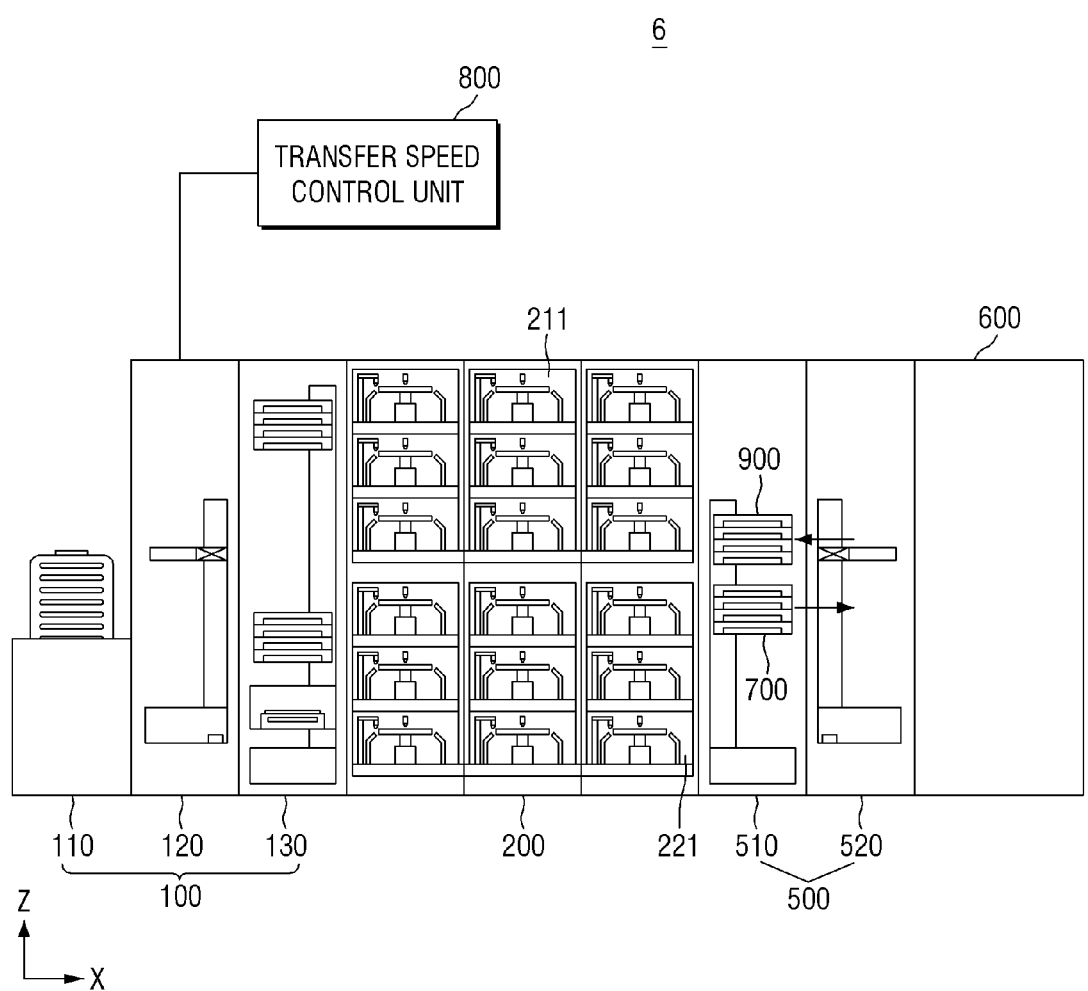
FIG. 17 is a side view illustrating the substrate processing apparatus of FIG. 16.

FIGS. 15 and 16 are diagrams illustrating a substrate processing apparatus according to some embodiments of the present disclosure. FIG. 17 is a side view illustrating the substrate processing apparatus of FIG. 16. For convenience of description, points different from those described with reference to FIGS. 9 to 14 will be mainly described.

Referring to FIG. 15, a substrate processing apparatus 5 may include a first humidity control unit 700 disposed in a baking unit 300 and a second humidity control unit 900 disposed in a second buffer module 510.

The first humidity control unit 700 may increase the total amount of moisture to which the substrate W is exposed in the substrate processing apparatus 5 by supplying vapor. The second humidity control unit 900 may supply an inert gas or CDA to reduce the total amount of moisture to which the substrate W is exposed in the substrate processing apparatus 5.

In some embodiments, before the substrate W is soft-baked in the baking unit 300 and then the substrate W is irradiated with light in an exposure unit 600, the substrate processing apparatus 5 may allow the substrate W to pass through the first humidity control unit 700. For example, before the soft-baked substrate W is subjected to exposure treatment, the substrate processing apparatus 5 may allow the substrate W to pass through the first humidity control unit 700 to increase the amount of moisture to which the substrate W is exposed.

In some embodiments, the substrate processing apparatus 5 may allow the substrate W irradiated with light in the exposure unit 600 to pass through the second humidity control unit 900 before providing the substrate W to the baking unit 300. For example, the substrate processing apparatus 5 may allow the substrate W to pass through the second humidity control unit 900 before post-baking the substrate W in the baking unit 300, thereby reducing the total amount of moisture to which the substrate W is exposed in the substrate processing apparatus 5. In this case, the substrate W may pass through the second humidity control unit 900 disposed in the second buffer module 510 to reduce the amount of moisture to which the substrate W is exposed in a process of transferring the substrate W from the exposure unit 600 to the baking unit 300 through the second buffer module 510.

Referring to FIGS. 16 and 17, a substrate processing apparatus 6 may include a first humidity control unit 700 disposed in a second buffer module 510 and a second humidity control unit 900 disposed in a second buffer module 510.

The first humidity control unit 700 may increase the total amount of moisture to which the substrate W transferred from a spin unit 200 to an exposure unit 600 is exposed in the substrate processing apparatus 6. The first humidity control unit 700 may increase the total amount of moisture to which the substrate W is exposed in the substrate processing apparatus 6 by supplying vapor.

The second humidity control unit 900 may reduce the total amount of moisture to which the substrate W transferred from the exposure unit 600 to a baking unit 300 is exposed in the substrate processing apparatus 6. The second humidity control unit 900 may reduce the total amount of moisture to which the substrate W is exposed in the substrate processing apparatus 6 by supplying an inert gas or CDA.

The first and second humidity control units 700 and 900 may be stacked and arranged in the second buffer module 510.

Figure 18:
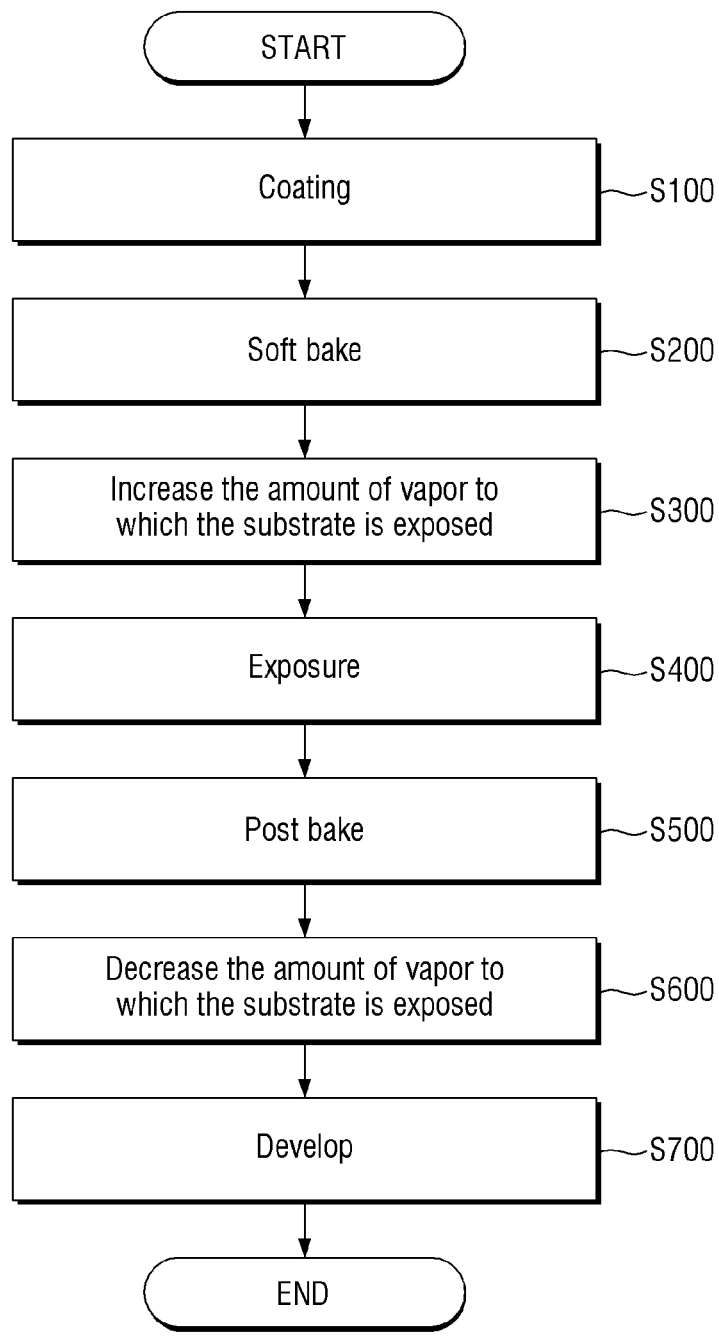
FIG. 18 is a flowchart illustrating a method of fabricating a semiconductor device using a substrate processing apparatus according to some embodiments.

FIG. 18 is a flowchart illustrating a method of fabricating a semiconductor device using a substrate processing apparatus according to some embodiments. FIGS. 19 to 23 are intermediate operation diagrams illustrating a method of fabricating a semiconductor device using a substrate processing apparatus according to some embodiments. For reference, FIG. 18 is an exemplary flowchart, and the method of fabricating the semiconductor device is not limited thereto. For example, another process operation may be added between operations S100 to S700.

Referring to FIG. 18, a photoresist film 10 is applied on a substrate W in operation S100.

Figure 19:
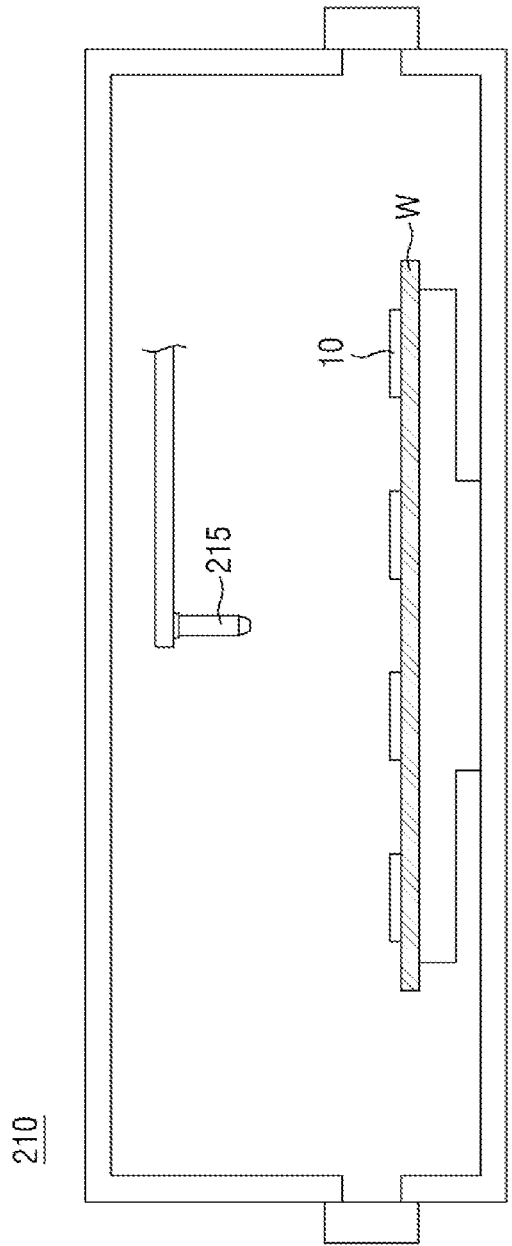
FIGS. 19 to 23 are intermediate operation diagrams illustrating a method of fabricating a semiconductor device using a substrate processing apparatus according to some embodiments.

Referring to FIG. 19, the photoresist film 10 may be applied on the substrate W in a coating unit 210. The photoresist film 10 may include a metal material. For example, the photoresist film 10 may include a metal photoresist.

Referring again to FIG. 18, the substrate W is soft-baked in operation S200.

Figure 20:
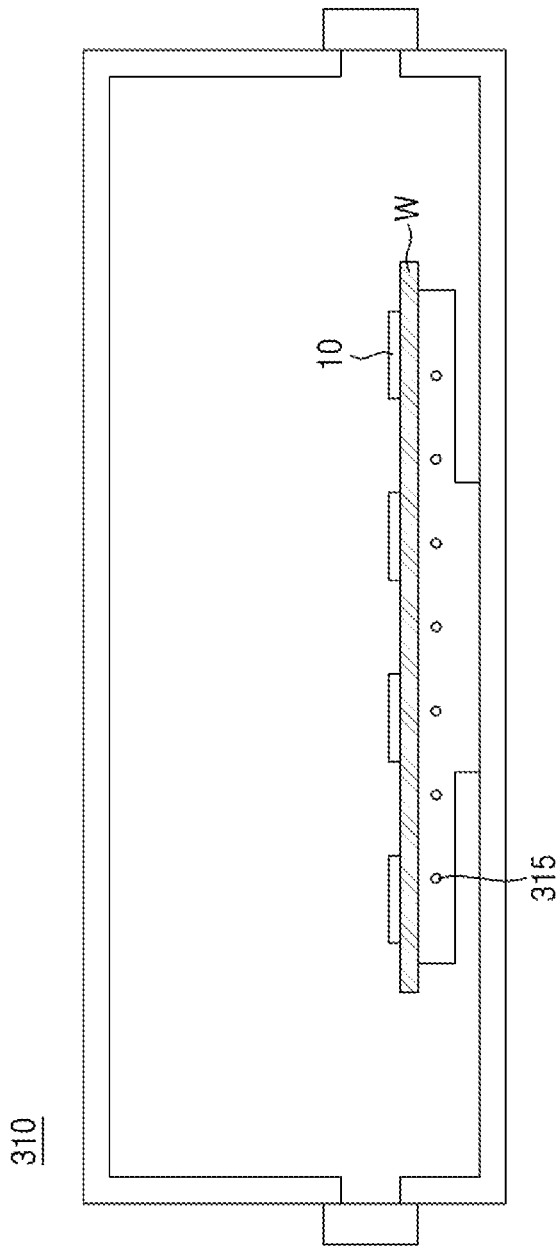

Referring to FIG. 20, the substrate W may be baked in a baking chamber 310. The baking chamber 310 may include a heating plate 315. The substrate W on which the photoresist film 10 is applied may be heated on the heating plate 315 of the baking chamber 310.

Referring again to FIG. 18, the amount of moisture to which the substrate W is exposed is increased in operation S300.

Figure 21:
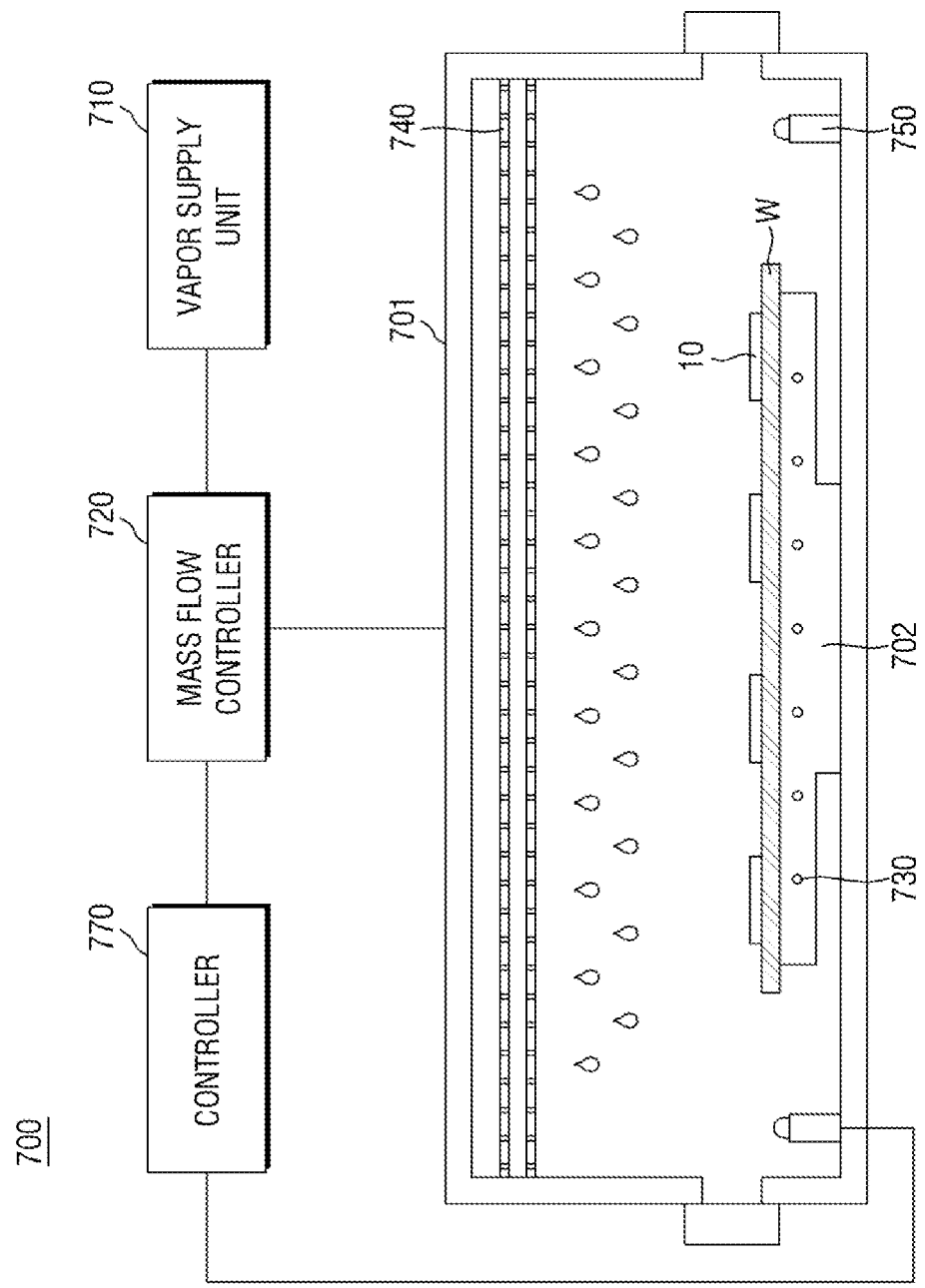

Referring to FIG. 21, vapor may be supplied above the substrate W in a first humidity control unit 700. In the first humidity control unit 700, the substrate W may be exposed to a relatively increased amount of vapor.

Referring again to FIG. 18, the substrate W is exposed in operation S400.

Figure 22:
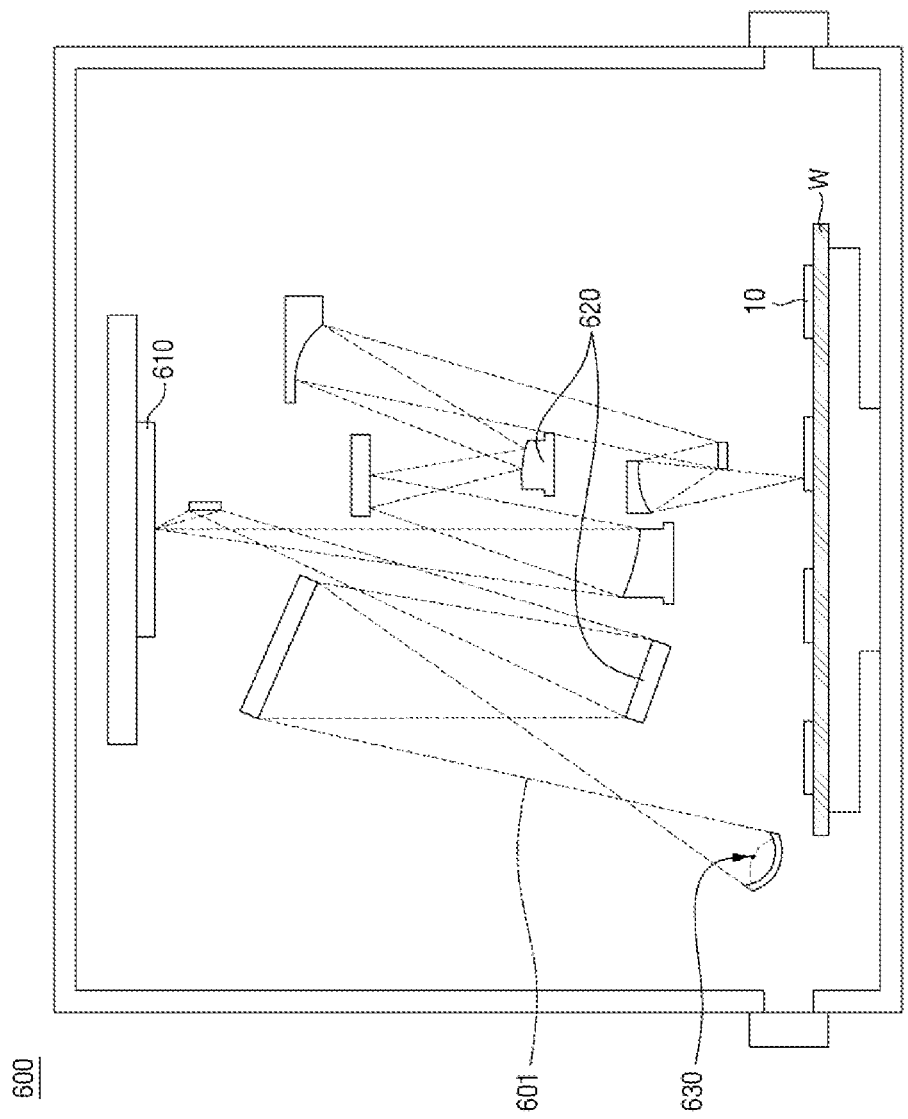

Referring to FIG. 22, the substrate W is irradiated with light in an exposure unit 600. The exposure unit 600 may include a light source 610, an optical system 620, and an EUV source 630. EUV is irradiated on the substrate W by the exposure unit 600 using the light source 610, the optical system 620, and the EUV source 630.

The EUV source 630 may be disposed on one side of the chamber. The EUV source 630 may generate an EUV beam 601. The EUV beam 601 may be a plasma beam. For example, the EUV source 630 may provide pump light to a metallic liquid droplet of tin (Sn), xenon (Xe) gas, titanium (Ti), or lithium (Li) to generate the EUV beam 601.

Referring again to FIG. 18, the exposed substrate W is baked in operation S500.

Referring to FIG. 20, the substrate W may be heated in the baking chamber 310.

Referring again to FIG. 18, the amount of moisture to which the substrate W is exposed is reduced in operation S600.

Figure 23:
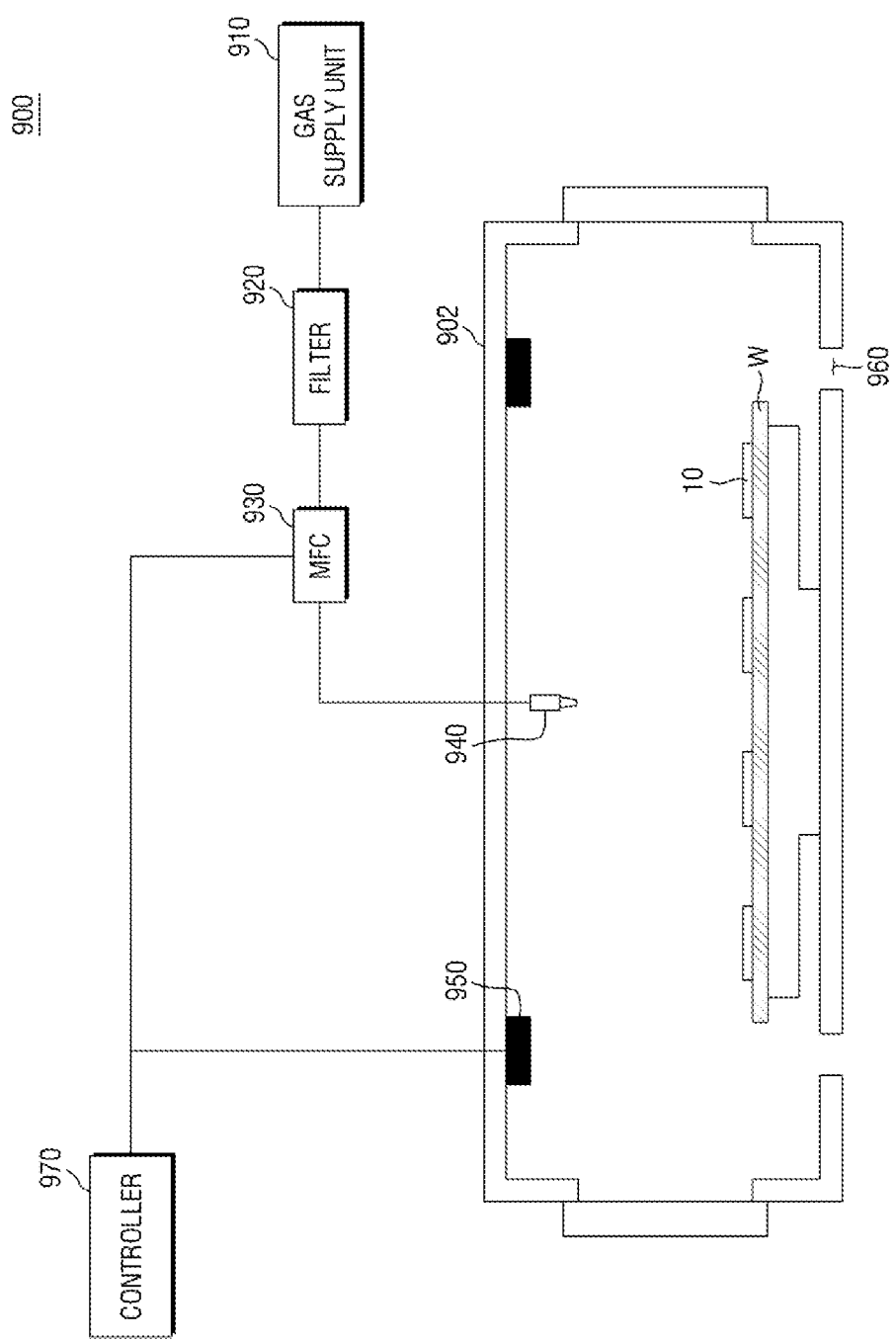

Referring to FIG. 23, the substrate W may be exposed to a relatively small amount of moisture in a second humidity control unit 900. For example, an inert gas or clean dry air (CDA) may be supplied to the substrate W in the second humidity control unit 900.

Referring again to FIG. 18, the substrate W is developed in operation S700.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A substrate processing apparatus comprising:
   a photoresist coater configured to apply a photoresist film on a substrate;
   a humidifier configured to increase an amount of moisture in an ambient to which the photoresist film on the substrate is exposed;
   an exposer configured to irradiate the photoresist film exposed to the ambient having the increased amount of moisture with light, wherein the humidifier is disposed between the photoresist coater and the exposer;
   a substrate stocker disposed between the photoresist coater and the exposer;
   a plurality of baking chambers facing the photoresist coater and configured to bake the substrate provided from the photoresist coater; and
   a dehumidifier configured to reduce an amount of moisture in an ambient to which the exposed substrate provided from the exposer is exposed, wherein the dehumidifier is stacked with the substrate stocker or the plurality of baking chambers.

2. The substrate processing apparatus of claim 1,
   wherein the exposer includes an extreme ultraviolet (EUV) source that irradiates EUV light to the photoresist film on the substrate.

3. The substrate processing apparatus of claim 1, further comprising:
   a substrate stocker disposed between the photoresist coater and the exposer and configured to store the substrate with the photoresist film,
   wherein the humidifier is disposed in the substrate stocker.

4. The substrate processing apparatus of claim 3,
   wherein the substrate stocker includes:
      a first buffer tower temporarily storing the substrate provided from the photoresist coater, and
      a second buffer tower temporarily storing the exposed substrate provided from the exposer, and
   wherein the humidifier is disposed between the first buffer tower and the second buffer tower.

5. The substrate processing apparatus of claim 3,
   wherein the substrate stocker includes:
      a first buffer chamber temporarily storing the substrate provided from the photoresist coater, and
      a second buffer chamber temporarily storing the exposed substrate provided from the exposer, and
   wherein the humidifier and the first buffer chamber are vertically stacked on each other.

6. The substrate processing apparatus of claim 1,
   wherein the substrate stocker includes:
      a first buffer chamber temporarily storing the substrate provided from the photoresist coater, and
      a second buffer chamber temporarily storing the exposed substrate provided from the exposer.

7. The substrate processing apparatus of claim 1, further comprising:
   a transfer unit configured to transfer the substrate among the photoresist coater, the plurality of baking chambers, and the exposer; and
   another dehumidifier that is disposed in the transfer unit.

8. The substrate processing apparatus of claim 1,
   wherein the humidifier includes a plate configured to heat the substrate with the photoresist film within the humidifier.

9. A substrate processing apparatus, comprising:
   a photoresist coater configured to apply a photoresist film on a substrate;
   a humidifier configured to increase an amount of moisture in an ambient to which the photoresist film on the substrate is exposed;
   an exposer configured to irradiate the photoresist film exposed to the ambient having the increased amount of moisture with light, wherein the humidifier is disposed between the photoresist coater and the exposer;
   a dehumidifier configured to reduce an amount of moisture of an ambient to which the exposed substrate provided from the exposer is exposed;
   a baking unit including a first baking chamber spaced apart from the dehumidifier by a first distance and a second baking chamber spaced apart from the dehumidifier by a second distance greater than the first distance, and configured to bake the exposed substrate by the exposer;
   a transfer unit configured to transfer the substrate from the dehumidifier to the baking unit; and
   a transfer speed controller configured to control a transfer speed of the substrate received from the dehumidifier being transferred in the transfer unit,
   wherein the transfer speed controller controls the transfer unit to transfer the substrate from the dehumidifier to the first baking chamber at a first speed, and to transfer the substrate from the dehumidifier to the second baking chamber at a second speed faster than the first speed.

10. A substrate processing apparatus comprising:
   a photoresist coater configured to apply a metal photoresist film on a substrate;
   an exposer configured to irradiate the metal photoresist film with light;
   a photoresist develop unit configured to develop the irradiated metal photoresist film on the substrate;
   a baking unit configured to bake the substrate with the developed photoresist film;
   a dehumidifier configured to reduce an amount of moisture in an ambient to which the substrate is exposed,
   wherein the dehumidifier is spatially separated from the photoresist coater, the exposer, the photoresist develop unit, and the baking unit,
   wherein the photoresist coater and the photoresist develop unit are disposed in a first area,
   wherein the baking unit is disposed in a second area facing the first area, and
   wherein the dehumidifier is disposed in a space between the first area and the second area; and a transfer unit disposed in the space between the first area and the second area and configured to transfer a substrate received from one of the photoresist coater and the photoresist develop unit using a transfer robot, wherein the transfer robot passes through the dehumidifier.

11. The substrate processing apparatus of claim 10, wherein the baking unit includes a plurality of baking chambers.

12. The substrate processing apparatus of claim 10, wherein the exposer includes an extreme ultraviolet (EUV) source that irradiates EUV light on the substrate with the metal photoresist film.

13. The substrate processing apparatus of claim 10, further comprising:

a substrate stocker disposed between the exposer and a processing unit including the photoresist coater, the photoresist develop unit and the baking unit, wherein the dehumidifier is disposed in the substrate stocker.

14. The substrate processing apparatus of claim 13, wherein the substrate stocker includes a cooling plate configured to cool a substrate received from the processing unit.

15. A substrate processing apparatus comprising:

a photoresist coater configured to apply a photoresist film on a substrate;

an exposer configured to irradiate the photoresist film with extreme ultraviolet (EUV) light;

a photoresist develop unit configured to develop the photoresist film on the substrate exposed by the exposer;

a baking unit configured to bake the substrate with developed photoresist;

a humidifier configured to increase an amount of moisture in an ambient to which the substrate is exposed; and a dehumidifier configured to reduce an amount of moisture in an ambient to which the substrate is exposed, wherein the baking unit includes a plurality of baking chambers facing the photoresist coater and configured to bake the substrate, wherein the humidifier is stacked with the plurality of baking chambers, and wherein the dehumidifier is disposed between the photoresist coater and the exposer.

16. The substrate processing apparatus of claim 15, wherein the humidifier includes a heating plate configured to heat the substrate.

* * * * *